US008351428B2

(12) United States Patent
Kim et al.

(10) Patent No.: US 8,351,428 B2
(45) Date of Patent: Jan. 8, 2013

(54) METHOD OF PROCESSING TRAFFIC INFORMATION AND DIGITAL BROADCAST SYSTEM

(75) Inventors: Jin Pil Kim, Seoul (KR); Young In Kim, Seoul (KR); Ho Taek Hong, Seoul (KR); In Hwan Choi, Gyeonggi-do (KR); Kook Yeon Kwak, Gyeonggi-do (KR); Hyoung Gon Lee, Seoul (KR); Byoung Gill Kim, Seoul (KR); Jin Woo Kim, Seoul (KR); Jong Moon Kim, Gyeonggi-do (KR); Won Gyu Song, Seoul (KR)

(73) Assignee: LG Electronics Inc., Seoul (KR)

( * ) Notice: Subject to any disclaimer, the term of this patent is extended or adjusted under 35 U.S.C. 154(b) by 284 days.

(21) Appl. No.: 12/654,821

(22) Filed: Jan. 5, 2010

(65) Prior Publication Data

US 2010/0172377 A1 Jul. 8, 2010

Related U.S. Application Data

(63) Continuation of application No. 11/541,588, filed on Oct. 3, 2006, now Pat. No. 7,668,209.

(30) Foreign Application Priority Data

| | | |
|---|---|---|
| Oct. 5, 2005 | (KR) | 10-2005-0093639 |
| Oct. 17, 2005 | (KR) | 10-2005-0097452 |
| Apr. 29, 2006 | (KR) | 10-2006-0039117 |
| May 30, 2006 | (WO) | PCT/KR2006/002068 |
| Sep. 15, 2006 | (KR) | 10-2006-0089736 |

(51) Int. Cl.

| | |
|---|---|
| ***H04L 12/28*** | (2006.01) |
| ***H04L 12/56*** | (2006.01) |
| ***H04J 3/22*** | (2006.01) |
| ***H03M 13/03*** | (2006.01) |

(52) U.S. Cl. ........ 370/389; 370/390; 370/391; 370/392; 370/393; 370/394; 370/413; 370/414; 370/415; 370/416; 370/417; 370/418; 370/537; 370/538; 370/539; 370/540; 370/541; 370/542; 370/543; 370/544; 370/545; 714/792

(58) Field of Classification Search .......... 370/389–394, 370/413–418, 537–545; 714/792
See application file for complete search history.

(56) References Cited

U.S. PATENT DOCUMENTS 5,208,816 A 5/1993 Seshardi et al.

(Continued)

FOREIGN PATENT DOCUMENTS

CN 1239625 12/1999

(Continued)

OTHER PUBLICATIONS

Bev Marks, TPEG- Standardized at Last, Oct. 2005, EBU Technical Review, 14 pages.

(Continued)

*Primary Examiner* — Asad Nawaz
*Assistant Examiner* — Kai J. Chang
(74) *Attorney, Agent, or Firm* — McKenna Long & Aldridge LLP

(57) ABSTRACT

A digital broadcast transmitting/receiving system and a method for processing data are disclosed. The method for processing data may enhance the receiving performance of the receiving system by performing additional coding and multiplexing processes on the traffic information data and transmitting the processed data. Thus, robustness is provided to the traffic information data, thereby enabling the data to respond strongly against the channel environment which is always under constant and vast change.

10 Claims, 22 Drawing Sheets

U.S. PATENT DOCUMENTS

| | | | | |
|---|---|---|---|---|
| 5,544,060 | A | 8/1996 | Fujii et al. | |
| 6,232,917 | B1 | 5/2001 | Baumer et al. | |
| 6,434,477 | B1 | 8/2002 | Goss et al. | |
| 6,501,748 | B1 * | 12/2002 | Belaiche | 370/342 |
| 6,728,308 | B1 * | 4/2004 | Chu et al. | 375/222 |
| 6,889,355 | B1 * | 5/2005 | Calderbank et al. | 714/792 |
| 6,901,083 | B2 * | 5/2005 | Wei et al. | 370/536 |
| 6,993,062 | B1 | 1/2006 | Kong et al. | |
| 7,277,709 | B2 | 10/2007 | Vadgama | |
| 7,646,774 | B2 * | 1/2010 | Kim et al. | 370/395.64 |
| 7,668,209 | B2 * | 2/2010 | Kim et al. | 370/537 |
| 7,720,878 | B2 * | 5/2010 | Caldwell et al. | 707/803 |
| 7,804,860 | B2 * | 9/2010 | Kim et al. | 370/537 |
| 7,907,635 | B2 * | 3/2011 | Kim et al. | 370/487 |
| 8,027,369 | B2 * | 9/2011 | Kim et al. | 370/532 |
| 8,040,924 | B2 * | 10/2011 | Kim et al. | 370/532 |
| 8,208,501 | B2 * | 6/2012 | Kim et al. | 370/532 |
| 2001/0001848 | A1 | 5/2001 | Oshizawa et al. | |
| 2001/0011213 | A1 | 8/2001 | Hindie et al. | |
| 2002/0056103 | A1 | 5/2002 | Gong | |
| 2002/0082767 | A1 | 6/2002 | Mintz | |
| 2002/0154709 | A1 | 10/2002 | Choi et al. | |
| 2002/0194570 | A1 * | 12/2002 | Birru et al. | 714/792 |
| 2004/0090997 | A1 | 5/2004 | Choi et al. | |
| 2004/0148642 | A1 | 7/2004 | Park et al. | |
| 2004/0198339 | A1 | 10/2004 | Martin | |
| 2005/0111586 | A1 * | 5/2005 | Kang et al. | 375/321 |
| 2006/0159183 | A1 * | 7/2006 | Gaddam et al. | 375/240.26 |
| 2007/0076584 | A1 | 4/2007 | Kim et al. | |
| 2007/0076585 | A1 | 4/2007 | Kim et al. | |
| 2007/0076586 | A1 | 4/2007 | Kim et al. | |
| 2007/0076721 | A1 | 4/2007 | Kim et al. | |
| 2007/0076758 | A1 | 4/2007 | Kim et al. | |
| 2007/0076759 | A1 | 4/2007 | Kim et al. | |
| 2007/0086488 | A1 | 4/2007 | Kim et al. | |
| 2008/0089221 | A1 * | 4/2008 | Bruninghaus et al. | 370/203 |

FOREIGN PATENT DOCUMENTS

| | | | |
|---|---|---|---|
| CN | 1417061 | | 5/2003 |
| CN | 1522508 | | 8/2004 |
| CN | 1614964 | | 5/2005 |
| DE | 10060599 | A1 | 6/2002 |
| JP | 10-322228 | A | 12/1998 |
| JP | 11-160081 | | 6/1999 |
| JP | 2001-082967 | A | 3/2001 |
| JP | 2001-227963 | A | 8/2001 |
| JP | 2005-056061 | A | 3/2005 |
| KR | 10-1999-025959 | | 10/1999 |
| KR | 10-2001-0055543 | | 7/2001 |
| KR | 10-2002-0082268 | | 10/2002 |
| KR | 10-2002-0094427 | A | 12/2002 |
| KR | 10-2003-0026236 | | 3/2003 |
| KR | 10-2004-0083248 | A | 10/2004 |
| KR | 10-2005-0077255 | | 8/2005 |
| KR | 10-2005-0091057 | | 9/2005 |
| KR | 100565089 | | 3/2006 |
| KR | 10-2006-0063563 | | 6/2006 |
| KR | 10-2006-0063629 | | 6/2006 |
| KR | 10-2006-0076574 | | 7/2006 |
| KR | 10-2006-0129769 | A | 12/2006 |
| WO | WO 0030058 | A | 5/2000 |
| WO | WO 0131497 | A1 | 5/2001 |
| WO | WO 2005/005759 | | 1/2005 |
| WO | WO 2005/052935 | | 6/2005 |
| WO | WO 2005/115001 | | 12/2005 |

OTHER PUBLICATIONS

Rich Chemock, PSIP Generation and ATSC Stream Monitoring, Oct. 8, 2004, Triveni Digital, WEBE SMPTE; 63 pages.

A/53D ATSC Standard; Digital Television Standard (A/53), Revision D, Including Amendment No. 1, Jul. 27, 2005, 104 pages.

ISO/IEC 13818-1, Second Edition, Dec. 1, 2000, Information Technology—Generic Coding of Moving Pictures and Associated Audio Information: Systems, 174 pages.

* cited by examiner

FIG. 2

| | |
|---|---|
| <ctt_component (80)>:= | : Congestion and Travel Time |
| <intunti>(id), | : identifier, id=80 ~ 202 |
| <intunli>(n), | : data length in byte (n) ~ 204 |
| m*<status_component()>; | : status component ~ 206 |

FIG. 3A

| | |
|---|---|
| <status_component(00)>:= | : average speed on a link |
| <intunti>(id), | : identifier, id=00 |
| <intunti>(n), | : data length in byte (n) |
| <intunti>; | : speed (m/s*0.5) ~ 212 |

FIG. 3B

| | |
|---|---|
| <status_component(01)>:= | : travel time for a link |
| <intunti>(id), | : identifier, id=01 |
| <intunti>(n), | : data length in byte (n) |
| <intunti>; | : time(minute) ~ 222 |

FIG. 3C

| | |
|---|---|
| <status_component(02)>:= | : congestion type |
| <intunti>(id), | : identifier, id=03 |
| <intunti>(n), | : data length in byte (n) |
| <cti01>; | : congestion type |

FIG. 4A

| | |
|---|---|
| <status_component(00)>:= | : average speed on a link |
| <intunti>(id), | : identifier, id=00 |
| <intunti>(n), | : data length in byte (n) |
| <intunti>; | : speed (m/s*0.25) ~ 232 |

FIG. 4B

| | |
|---|---|
| <status_component(00)>:= | : average speed on al link |
| <intunti>(id), | : identifier, id=00 |
| <intunti>(n), | : data length in byte (n) |
| <intunti>; | : speed (km/h) ~ 242 |

FIG. 7

| Syntax | No. of Bits | Format |
|---|---|---|
| TPEG_service_descriptor(){ | | |
| descriptor_tag | 8 | uimsbf |
| descriptor_length | 8 | uimsbf |
| Number_of_TPEG_service_components | 8 | uimsbf |
| for(i=0;i<Number_of_TPEG_service_components;i++){ | | |
| Service_component_ID | 8 | uimsbf |
| Application_ID | 16 | uimsbf |
| Service_name | var | |
| Service_description | var | |
| Service_logo | var | |
| Subscriber_information | var | |
| Free_text_information | var | |
| Help_information | var | |
| } | | |
| } | | |

FIG. 8

| Descriptor Name | Descriptor Tag | PSI/PSIP Table | | | | | |
|---|---|---|---|---|---|---|---|
| | | PMT | MGT | VCT | EIT | DCCT | DCCSCT |
| stuffing descriptor | 0x80 | * | * | * | * | * | * |
| AC-3 audio descriptor | 0x81 | M | | | M | | |
| caption service descriptor | 0x86 | O | | | M | | |
| content advisory descriptor | 0x87 | O | | | M | | |
| program identifier descriptor | 0xnn | O | | | M | | |
| extended channel name descriptor | 0xA0 | | | M | | | |
| service location descriptor | 0xA1 | | | S | | | |
| time-shifted service descriptor | 0xA2 | | | M | | | |
| component name descriptor | 0xA3 | M | | | | | |
| dcc departing request descriptor | 0xA8 | | | | | M | |
| dcc arriving request descriptor | 0xA9 | | | | | M | |
| dcc location code descriptor | 0xAB | | | | | | M |
| user private | 0xC0-0xFE | * | * | * | * | * | * |
| TPEG service descriptor | 0xAC | M | | M | | | |

FIG. 9

| Syntax | No. of Bits | Format |
|---|---|---|
| virtual_channel_table_section(){ | | |
| table_id | 8 | 0xC8 |
| section_syntax_indicator | 1 | '1' |
| Private_indicator | 1 | '1' |
| reserved | 2 | '11' |
| section_length | 12 | uimsbf |
| transport_stream_id | 16 | uimsbf |
| reserved | 2 | '11' |
| version_number | 5 | uimsbf |
| current_next_indicator | 1 | bslbf |
| section_number | 8 | uimsbf |
| last_section_number | 8 | uimsbf |
| protocol_version | 8 | uimsbf |
| num_channels_in_section | 8 | uimsbf |
| for(i=0;i<num_channels_in_section;i++){ | | |
| short_name | 7*16 | uimsbf |
| reserved | 4 | '1111' |
| major_channel_number | 10 | uimsbf |
| minor_channel_number | 10 | uimsbf |
| modulation_mode | 8 | uimsbf |
| carrier_frequency | 32 | uimsbf |
| channel_TSID | 16 | uimsbf |
| program_number | 16 | uimsbf |
| ETM_location | 2 | uimsbf |
| access_controlled | 1 | bslbf |
| hidden | 1 | bslb |
| reserved | 6 | '111111' |
| service_type | 6 | uimsbf |
| source_id | 16 | uimsbf |
| reserved | 6 | '111111' |
| descriptors_length | 10 | uimsbf |
| for(i=0;i<N;i++){ | | |
| descriptors() | | |
| } | | |
| } | | |
| reserved | 6 | '111111' |
| additional_descriptors_length | 10 | uimsbf |
| for(j=0;j<N;j++){ | | |
| additional_descriptors() | | |
| } | | |
| CRC_32 | 32 | rpchof |
| } | | |

METHOD OF PROCESSING TRAFFIC INFORMATION AND DIGITAL BROADCAST SYSTEM

This application is a Continuation of application Ser. No. 11/541,588 filed on Oct. 3, 2006, now U.S. Pat. No. 7,668,209 which claims the benefit of Korean Patent Application Nos. 10-2005-0093639 filed on Oct. 5, 2005; 10-2006-0039117 filed on Apr. 29, 2006; 10-2006-0089736 filed on Sep. 15, 2006 and 10-2005-0097452 filed on Oct. 17, 2005 and PCT Application No. PCT/KR/2006/002068 filed on May 30, 2006, all of which are hereby incorporated by reference.

BACKGROUND OF THE INVENTION

1. Field of the Invention

The present invention relates to a digital broadcasting system, and more particularly, to a digital broadcast transmitting/receiving system and a method for processing traffic data.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can add video/audio data through a digital broadcasting (or television) channel so as to transmit diverse supplemental information needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the performance of the received digital signals may be deteriorated due to a ghost effect and noise caused by reflected waves. Therefore, a system highly resistant to (or robust against) ghost effects and noise is required to be developed. Particularly, in order for the supplemental data to be used in portable and mobile broadcast receivers, a higher degree of resistance (or robustness) against channel interruption and noise is required.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data or EVSB data. Furthermore, as the number of possessed automobiles (or cars) is in constant increase, and with the influence of the working-5-days-a-week policy (which eventually leads to an increase in the usage of cars), the need for traffic information is also increasing accordingly.

SUMMARY OF THE INVENTION

Accordingly, the present invention is directed to a digital broadcast transmitting/receiving system and a method for processing data that substantially obviate one or more problems due to limitations and disadvantages of the related art.

An object of the present invention is to provide a digital broadcast system and a method for processing data that can be compatible to the ATSC VSB system, that is suitable for transmitting enhanced data, and that is resistant to and robust against noise.

Another object of the present invention is to provide a digital broadcast transmitting/receiving system and a method for processing data that can effectively receive and transmit traffic information by applying the traffic information data as the enhanced data.

Another object of the present invention is to provide a digital broadcast transmitting/receiving system and a method for processing data that can enhance the receiving performance of the receiving system by performing additional coding on the traffic information data and transmitting the processed data.

A further object of the present invention is to provide a digital broadcast transmitting/receiving system and a method for processing data that can enhance the receiving performance of the receiving system by multiplexing the known data, which correspond to data known in advance according to an agreement between the transmitting system and the receiving system, and the traffic information data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital broadcast transmitter according to an embodiment of the present invention may include a traffic information message generator, a pre-processor, a multiplexer, a trellis encoder, and a transmitter.

The traffic information message generator may generate a traffic information message including status information, which includes information on at least one of an average speed of a traffic route and route travel time, and location information associated with the status information. The pre-processor may pre-process traffic information data including the traffic information message by encoding the traffic information data and by generating a traffic information data packet including the encoded traffic information data and known data. The multiplexer may multiplex the traffic information data packet with one or more main audio and video (AV) data packets. The trellis encoder may have at least one memory and trellis-encoding the multiplexed data packets, the at least one memory being initialized by initialization data when data outputted from the multiplexer correspond to a beginning of a known data sequence. The data transmission unit may insert synchronization data into the trellis-encoded data, modulating the trellis-encoded data having the synchronization data, and transmitting the modulated data.

In other aspect of the present invention, a digital broadcast transmitter may include a traffic information message generator, a pre-processor, a multiplexer, a post-processor, a data encoding and interleaving unit, a trellis encoder, and a transmitter.

The traffic information message generator may generate a traffic information message including status information, which includes information on at least one of an average speed of a traffic route and route travel time, and location information associated with the status information. The preprocessor may pro-process traffic information data including the traffic information message by encoding the traffic information data for at least one of error correction and error detection and by generating a traffic information data packet including the encoded traffic information data and known data. The multiplexer may multiplex the traffic information data packet with one or more main audio and video (AV) data packets. The post-processor post-processing the multiplexed data by encoding only traffic information data included in the multiplexed data with a coding rate of G/H, wherein G and H are positive integers and G is less than H. The data encoding and interleaving unit may add first parity data into the post-processed data and interleave the post-processed data having the first parity data. The trellis encoder may have at least one memory and trellis-encoding the interleaved data, the at least one memory being initialized by initialization data when data outputted from the data encoding and interleaving unit correspond to a beginning of a known data sequence. The data transmission unit may insert synchronization data into the trellis-encoded data, modulating the trellis-encoded data having the synchronization data, and transmitting the modulated data.

In another aspect of the present invention, a digital broadcast transmitter may include a traffic information message generator, a pre-processor, a multiplexer, a data encoding and interleaving unit, a post-processor, a trellis encoder, and a transmitter.

The traffic information message generator may generate a traffic information message including status information, which includes information on at least one of an average speed of a traffic route and route travel time, and location information associated with the status information. The preprocessor may pre-process traffic information data including a traffic information message by encoding the traffic information data for at least one of error correction and error detection and by generating a traffic information data packet including the encoded traffic information data and known data. The multiplexer may multiplex the traffic information data packet with one or more main audio and video (AV) data packets. The data encoding and interleaving unit may add first parity data into the multiplexed data and interleave the multiplexed data having the parity data. The post-processor may post-process the interleaved data by coding only traffic information data included in the interleaved data with a coding rate of G/H, wherein G and H are positive integers and G is less than H. The trellis encoder having at least one memory and trellis-encoding the post-processed data, the at least one memory being initialized by initialization data when data outputted from the post-processor correspond to a beginning of a known data sequence. The data transmission unit may insert synchronization data into the trellis-encoded data, modulating the trellis-encoded data having the synchronization data, and the transmitting the modulated data.

In another aspect of the present invention, a method of processing traffic data in a digital transmitter may include generating a traffic information message including status information, which includes information on at least one of an average speed of a traffic route and route travel time, and location information associated with the status information, generating at least one system information table required for decoding the traffic information message, and multiplexing the traffic information message and the system information table.

In another aspect of the present invention, a digital broadcast transmitter may include a traffic information message generator, a system information generator, and a multiplexer.

The traffic information message generator may generate a traffic information message including status information, which includes information on at least one of an average speed of a traffic route and route travel time, and location information associated with the status information. The system information generator may generate system information required for decoding a traffic information message. The multiplexer may multiplex the traffic information message and the system information.

In another aspect of the present invention, a data structure may include system information required for decoding a traffic information message including a traffic information message including status information, which includes information on at least one of an average speed of a traffic route and route travel time, and location information associated with the status information, the system information comprising a traffic information table which includes at least one of a traffic information application identifier, a service component identifier, and service information.

In another aspect of the present invention, a method of processing traffic information data in a digital broadcast receiver may include receiving traffic information data including a traffic information message and system information, demultiplexing the traffic information message and the system information from the traffic information data, and decoding the traffic information message using the system information, thereby extracting status information, which includes information on at least one of an average speed of a traffic route and route travel time, and location information associated with the status information.

In a further aspect of the present invention, a digital broadcast receiver may include a demodulator, a data demultiplexing and decoding unit, a data storage, and an application manager.

The demodulator may demodulate traffic information data including a traffic information message and system information and performing error correction to the demodulated data. The data demultiplexing and decoding unit may demultiplex the traffic information message and system information from the error-corrected data and decode the demultiplexed traffic information message using the system information. The data storage may store the system information and the decoded traffic information message. The application manager may provide a traffic information service to a user using the stored traffic information message by extracting status information, which includes information on at least one of an average speed of a traffic route and route travel time, and location information associated with the status information.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 2 illustrates a structure of congestion and travel time information included in a CTT event container;

FIGS. 3A through 3C illustrate average speed on a link, travel time for the link, and syntax for degree of congestion included in the status component of the CTT event container of FIG. 2;

FIGS. 4A through 4C illustrate structures of a status component delivering average speed on a link;

FIG. 7 illustrates a syntax structure of traffic information descriptors according to an embodiment of the present invention;

FIG. 8 illustrates an example of table that may include the traffic information descriptors of FIG. 7;

FIG. 9 illustrates a syntax structure on a virtual channel table wherein the traffic information descriptors of FIG. 7 are included according to an embodiment of the present invention;

DETAILED DESCRIPTION OF THE INVENTION

Figure 1:
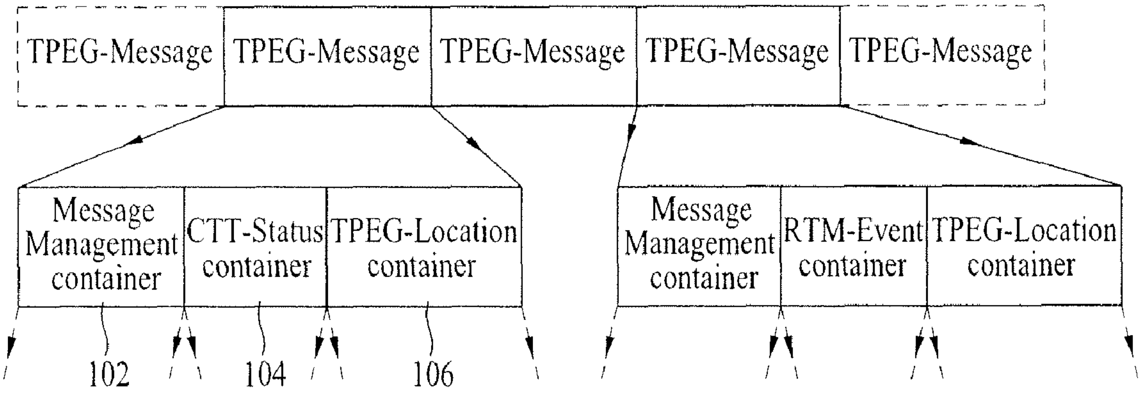
FIG. 1 illustrates a transmission format of traffic information according to the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the known data refer to a set of data known in advance according to an agreement between a transmitting system and a receiving system. The main data refer to a set of data that can be received by a conventional receiving system. Both known data and main data may include video data and/or audio data. Also, in the present invention, the enhanced data may refer to data including information, such as a program execution file, stock information, traffic information, and so on. The enhanced data may also include video data and/or audio data.

Such enhanced data may include traffic information, data for providing data service, system information for ground (or terrestrial) wave broadcasting such as PSI and/or PSIP, system information for cable broadcasting such as out of band system information (OOB-SI), supplemental data configured of diverse Java language or HTML language for data services providing a wide range of applications, audio data, and video data. The enhanced data may also include various control software for controlling the receiver, and meta data that are configured of an XML language, for example, in order to provide diverse information to the user.

In the description of the present invention, traffic information data will be applied for the enhanced data, so as to be transmitted and received. A road searching service and a traffic information providing service according to the present invention may be applied to a variety of digital broadcast standards. Representative examples of the digital broadcast standards are a European Digital Audio Broadcasting (DAB) service based on the Eureka-147 [ETSI EN 300 401], a Digital Video Broadcasting-Terrestrial (DVB-T) service provided in Europe, a Digital Video Broadcasting-Handheld (DVB-H) service also provided in Europe, a Media Forward Link Only (FLO) service provided in the United States, and a Digital Multimedia Broadcasting (DMB) service that is provided in the Republic of Korea. The DMB service of the Republic of Korea is classified into a Terrestrial Digital Multimedia Broadcasting (T-DMB) service based on the Eureka-147 and a Satellite Digital Multimedia Broadcasting (S-DMB) service using satellite communication.

Herein, the traffic information includes information on public transportation, congestion and/or travel time, road traffic, emergency events and situation, and so on. The traffic information also includes information associated with all types of transportation means including train, ship (or cruiser), airplane, and so on. Furthermore, the traffic information may also include information on factors that may influence traffic, such as travel information, information parking facilities, weather information, environmental pollution information, and so on. Most particularly, although the congestion and/or travel time (hereinafter referred to as "CTT") information is given as an example of the present invention, any other information type may be applied herein. Furthermore, as long as the term indicates a particular function, the terms used in the present invention are not limited only to the ones used in the description set forth herein.

The term "traffic status" is indicative of a road congestion status (i.e., a flow status), however, it is not limited to the above-mentioned road congestion status and can be applied to similar examples as necessary. For the convenience of description and better understanding of the present invention, the term "traffic status" is referred to as a Congestion and/or Travel Time Information (CTT) status. The above-mentioned CTT status includes CTT status information, and CTT status prediction information, additional information, and so on. The term "section" or "link" is indicative of a specific area of roads. However, it is not limited to the above-mentioned meanings and may be applied to other similar meanings as necessary.

The traffic information service according to the present invention is provided to the users by a receiver having only one or none of an electronic map and a GPS mounted therein in the form of at least one of a text, a voice, a graphic, a still image, and a motion picture. The traffic information data are configured and transmitted by traffic information message units. More specifically, the traffic information message is the smallest unit for transmitting the traffic information. Herein, information on a single traffic information application is included in a traffic information message. In the present invention, the term "Transport Protocol Expert Group (TPEG)" will be used on the traffic information for simplicity. Furthermore, as described above, as long as the term indicates a particular function, the terms used in the present invention are not limited only to the ones used in the description set forth herein.

The traffic information application corresponds to the highest hierarchy within an ISO/OSI protocol stack. Each traffic information application is assigned with a unique identification number, which is referred to as an application identification (AID). Each time a new application is developed and created, a new application identification is assigned. For example, each of the congestion and/or travel time (CTT) information, the road traffic message (RTM), the public transport information (PTI), and so on, is a traffic information application that is given unique application identification. The traffic information data correspond to a stream form including various traffic information messages. Herein, the traffic information messages correspond to at least one application.

FIG. 1 illustrates an example of two traffic information applications (e.g., CTT and RTM) being included in a stream.

Traffic information message generator(not shown in figure) generating a traffic information message can be a broadcast station. For simplicity of the description of the present invention, the traffic information message generator is referred to as a traffic information providing server. The traffic information message generator construct in a traffic information message unit traffic congestion information collected from various sources (e.g., operator input, or information received from another server or probe cars through a network).

At this point, each traffic information message has the same container configuration, which may be referred to as a traffic information (or TPEG) message container. The CTT message container described herein corresponds to one of the traffic information message containers. More specifically, the CTT message container according to the present invention, which transmits the CTT message, includes a CTT message management container 102, a CTT-status container 104, and a TPEG-location container 106.

The above-mentioned CTT message management container 102 includes a message identification information and date and time information, and uses the message identification information and the date and time information as management information of the information received by the receiving system. The message ID information requisite for the message includes a message identifier (MID) and a version number (VER). In this case, the message ID (MID) is indicative of an identifier of a single message associated with individual status of a service component. The MID according to the present invention gradually increases the MID number from 0 by a predetermined number "1" at a time. If the MID value reaches the maximum value "65535", the maximum value "65535" is initialized to zero. The version number (VER) is indicative of a sequential number for identifying successive messages having a single message ID. The version number according to the present invention may be determined to be any one of 0 to 255, and it should be noted that the version number is sequentially increased in the range from 0 to 255.

The CTT status container 104 may include congestion and/or travel time status and predicted congestion and travel time status of links, i.e., road segments. The CTT status container 104 may include average link speed, link travel time, link delay, or congestion type, etc.

The TPEG location container 106 may employ various location reference processes. For example, a location reference process using a coordinate system or a location reference process using pre-promised links may be used. When a coordinate system is used, the coordinates (latitudes and longitudes) of the start and end positions of a link for which the CTT message is created, may be transmitted. When a reference process using pre-promised links is used, a unique identification for a specific link on a receiving device may be transmitted. For example, a receiving device may include a locally stored network of links, wherein each link may be identified by a unique identifier. A link may refer to a road segment which starts and ends at junctions and has no junction in between. The coordinate system may be the WGS 84 model. A text formatted name of the link may be transmitted.

In various implementations, a CTT status container and a TPEG location container, are composed of one or more CTT components. A CTT status container 104 may be composed of one component or a plurality of CTT components. In various implementations, CTT components including an ID of 80 h (notation 'h' means hexadecimal) or 84 h includes one or more status components including basic traffic information such as the average link speed, link travel time, link delay, or congestion type. In the description, specific IDs are described as assignments to structures associated with specific information. The actual value of an assigned ID (e.g., 80 h) is exemplary, and different implementations may assign different values for specific associations or circumstances.

In various implementations, CTT components including an ID of 81 h include one or more status components including predicted CTT status. The predicted CTT status may include predicted average link speed, predicted link travel time, or congestion acceleration tendency. The congestion acceleration tendency may include information indicative of the tendency of congestion status. The congestion acceleration tendency will be described as a type of prediction information as the congestion status in the near future may be predicted from it.

In various implementations, the CTT message may comprise CTT components structured to deliver additional information of traffic information. An identifier 8 Ah may be assigned to the CTT component carrying additional information, and a language code that is indicative of language used for the additional information may also be included in the CTT component.

FIG. 2 illustrates a syntax, according to various implementations, of a structure of a congestion and travel time information component (hereinafter, referred to as CTT component) belonging to a CTT event container (e.g., at reference numeral 22 for FIG. 2). The FIG. 2 CTT component has an ID of '0x80' 3*a*, includes m status components 3*c*, and has a field expressed in byte 3*b* indicating the length of the whole data of the status components included therein.

Status components may, for example, use 8 bits to transfer average speed on a link, travel time for a link, and/or information about degree of congestion in a format illustrated in FIGS. 3A through 3C. In one implementation, an ID of '00' is assigned to average speed on a link; an ID of '01' is assigned to travel time for a link; and an ID of '03' is assigned to degree of congestion.

A numeric value expressed in units such as, for example, of 0.5 m/s (namely, 1.8 km/h) may be carried in the field 41 for average speed on a link ('intunti' denotes size of byte) and a numeric value expressed in units such as, for example, minutes is carried in the field for travel time for a link 42. Information about travel time for a link may be obtained by retrieving the link length from a link information (e.g., link length, link width, etc.) database constructed in the server 100 and dividing the link length by average speed on the corresponding link obtained from traffic information collected from various sources, being provided after further rounding off to the units of minute (e.g., a travel time exceeding 30 seconds is rounded off to one minute).

In one implementation, if average speed on a link is transmitted in the units of 0.5 m/s (1.8 km/h), the allowable range of the speed in 8-bit expression may amount to 0~459 km/h. Since it may be unnecessary to express the average speed up to a very high value (e.g., beyond 200 km/h), it may be better to consider a very high speed (e.g., average speed higher than 200 km/h) to be resulting from drivers speeding in the corresponding link rather than current traffic condition. Accordingly, from a viewpoint of providing traffic congestion information, it may be useless to provide information indicating up to a very high speed.

On the other hand, in the case of traffic congestion, even 1 km/h difference in the average speed may be an important factor for a driver to choose a particular route. In this respect, a resolution of 1.8 km/h cannot discriminate 1 km/h difference in the average speed. Therefore, when average speed on a link becomes low, the average speed information expressed in units of 0.5 m/s (−1.8 km/h) may not satisfy drivers requirement on the degree of resolution.

Similarly, if travel time for a link is provided in units of minute, round-off error may become large when the length of the link is short. For example, if the link length is 500 meters and average speed on the link is 20 m/s (=72 km/h), travel time for the link will become 25 seconds; if the link length is 1000 meters and average speed on the link is 20 m/s, travel time for the link will become 50 seconds; for another example, if the link length is 2900 meters and average speed on the link is 20 m/s, travel time for the link will be 145 seconds. In these cases, the travel time for the link delivered to the status component corresponds to 0, 1, and 2 minutes, respectively; therefore, the difference between actual travel time and the travel time provided by traffic information amounts to 25, 10, and 25 seconds. These errors may become more prominent in links of short lengths.

Therefore, in various implementations, as to the delivery of information about average speed on a link, the maximum speed is lower than may be introduced to improve resolution in low speed links. Likewise, as to the delivery of information about travel time for a link, information expressed in units of seconds may be permitted an 8 bit representation may be employed for delivering information about travel time for a link expressed in units of seconds; however, additional bits may also be assigned to deliver the information expressed in units second.

As shown in FIG. 4A, in one implementation, the following format for delivering information about average speed on a link may be employed: 0.25 m/s (=0.9 km/h). By using the speed unit, the maximum speed that an 8-bit field indicative of average speed 51 may represent becomes 229.5 km/h.

The unit of 0.25 m/s is only an arbitrary example; therefore, in order to increase the speed resolution in a link of slow speed, a much lower unit, for example, 0.2 m/s (the maximum allowable speed for representation is 183.6 km/h) or 0.15 m/s (the maximum allowable speed for representation is 137.7 km/h) may be employed. Increasing speed resolution by lowering the speed unit is advantageous for the cases where traffic regulations restrict the maximum speed (e.g., to 110 km/h).

As shown in FIG. 4B, average speed on a link may also be provided in units of 1 km/h. According to this implementation, the allowable range that the field indicative of average speed 52 may represent becomes 0~255 km/h and figures below a decimal point do not occur. Although the maximum speed allowable for representation is decreased in the implementation of FIG. 4B compared with the example of FIG. 3A (459 km/h→255 km/h), the speed resolution is improved by 0.8 km/h (1.8 km/h→1 km/h).

Figure 4C:
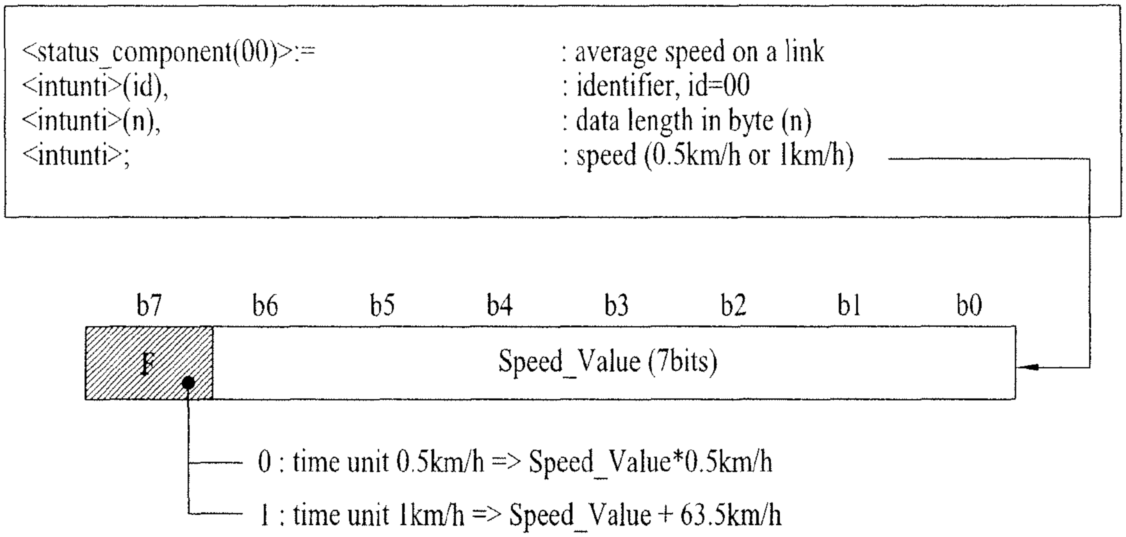

The speed resolution may play an important role depending on the magnitude of the average speed on the current link. As described earlier, when the average speed on a link is low, a driver may respond sensitively to a slight change of the average speed, whereas the driver may show lower sensitivity against a slight change of the average speed if the average speed on the link is high. Therefore, in various implementations, a variable speed unit may be employed in accordance with the magnitude of the average speed. FIG. 4C illustrates an example of a structure of the average speed field of a status component according to one implementation. The most significant bit (F) designates a speed unit on which the average speed represented by the remaining 7 bits (Speed Value) is based. For example, if the most significant bit (F) is 0, it implies that the value carried by the remaining 7 bits (Speed Value) corresponds to the average speed expressed in units of 0.5 km/h; when the most significant bit (F) is 1, the value carried by the remaining 7 bits (Speed_Value) corresponds to the average speed expressed in units of 1 km/h.

In the implementation of FIG. 4C, since the maximum speed that may be expressed in 0.5 km/h unit is 63.5 km/h (=127*0.5 km/h), when the most significant bit (F) is 1, the average speed amounts to the sum of what the remaining 7 bits represent and 63.5 km/h. As to a high speed value, an integer value of 63 km/h may be added instead of 63.5 km/h. For example, if the average speed field is 1:0001100, the average speed to be delivered will be 759.5 km/h (=12 km/h+63.5 km/h) or 759 km/h (=12 km/h+63 km/h).

Specifying the speed resolution with the two different units of 0.5 km/h and 1 km/h in the implementation of FIG. 4C is only an example; a different resolution from the specified unit may be employed. Therefore, a variable resolution depending on the magnitude of the average speed on a link should be considered to fall within the scope, even though an employed speed resolution may be different from what is described in the this disclosure.

An implementation of a format delivering information about travel time for a link is illustrated in FIGS. 5A through 5D.

Figure 5A:
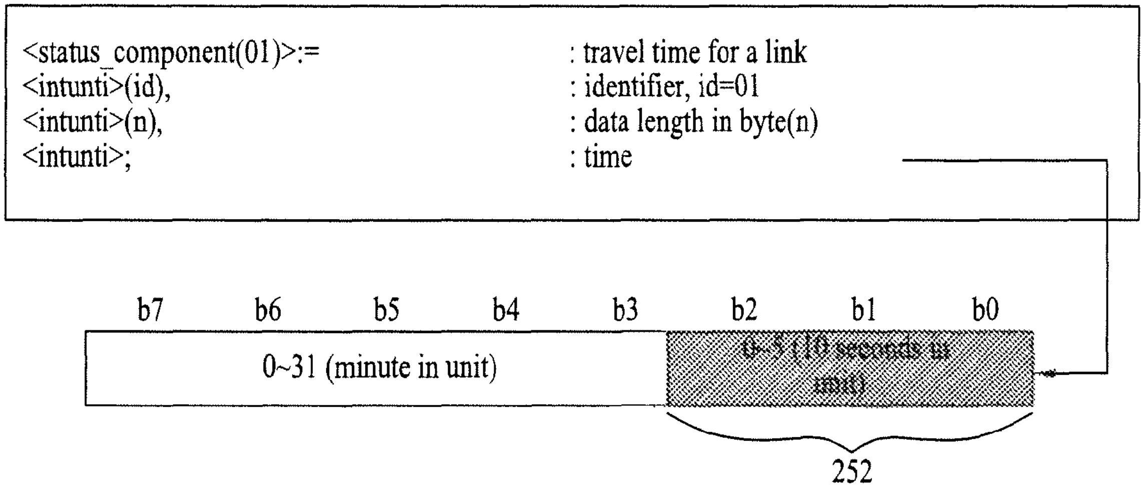
FIGS. 5A through 5E illustrate information structures for travel time for a link.

In the implementation of FIG. 5A, the higher 5 bits of 8 bits are reserved for minutes and lower 3 bits 61 are reserved for seconds. Since the allowable range that the lower 3 bits can express is from 0 to 7, the lower 3 bits 61 records the value of tens of the element expressed in second from the travel time for a link. That is to say, from the three examples described earlier, since the travel time for the link is 25, 50, and 145 seconds (2 minutes and 25 seconds), the lower 3 bits 61 records 3 (which corresponds to 30—5 seconds are rounded off), 5 (which corresponds to 50), and 3 (which corresponds to 30); the higher 5 bits records 0, 0, and 2, respectively. In the present implementation, respective errors become 5, 0, and 5 seconds and relative error magnitudes are reduced to 20%

(=5/25), 0% (=0/10), and 20% (=5/25), being reduced to 13.3% on the average compared with the case expressed in minute.

Figure 5B:
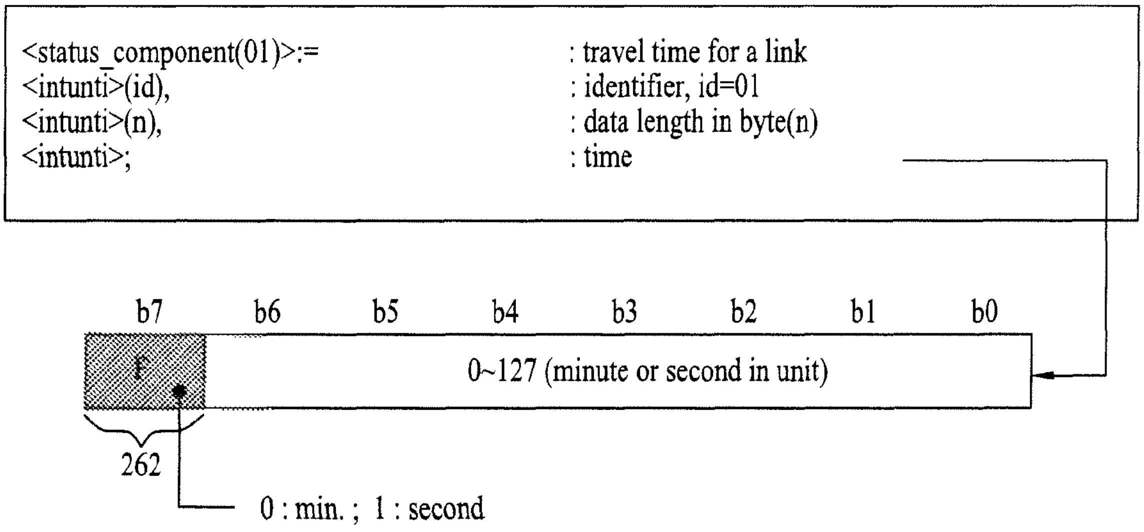

In the implementation of FIG. 5B, the time unit for the 8 bit expression is varied as needed. More specifically, lower 7 bits are reserved to represent travel time for a link in units of minute or second; the most significant bit 62 is used as a flag to designate whether the content recorded in the 7 bits is measured in units of minute or second. When the content is expressed in minute, 0 is assigned, whereas 1 is assigned when the content is expressed in second. Since the travel time for the link is 25, 50, and 145 seconds from the previous three examples, 10011001 (flag=1), 10110010 (flag=1), and 00000010 (flag=0) (=2 minutes) or 11111111 (flag=1) (=127 seconds) are recorded in the 8 bits, respectively. In the present implementation, respective errors become 0, 0, and 25 seconds (or 18 seconds) and relative error magnitudes are 0%, 0%, and 100% (or 72%), being reduced to 33.3% (or 24%) on the average compared with the case expressed in minute.

Figure 5C:
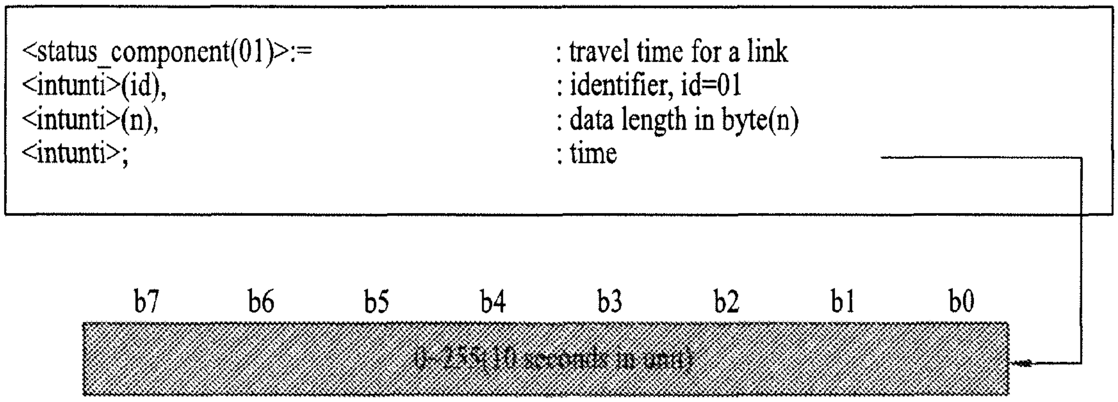

In the implementation of FIG. 5C, the entire 8 bits are used to record travel time for a link, the recording unit being less than 60 seconds and larger than 1 second (e.g., 10 seconds). Since the travel time for the link is 25, 50, and 145 seconds from the previous three examples, 3 (5 seconds are rounded off), 5, and 15 are each recorded in the 8 bits according to the implementation of FIG. 5C. In the present implementation, respective errors become 5, 0, and 5 seconds and relative error magnitudes are 20%, 0%, and 20%, being reduced to 13.3% on the average compared with the case expressed in minute. Although the present implementation shows identical results to those from the implementation of FIG. 5A, the maximum time allowable for expressing travel time for a link is 2550 seconds (4 minutes and 30 seconds), thereby being larger than 31 minutes and 50 seconds of the implementation of FIG. 5A.

Figure 5D:
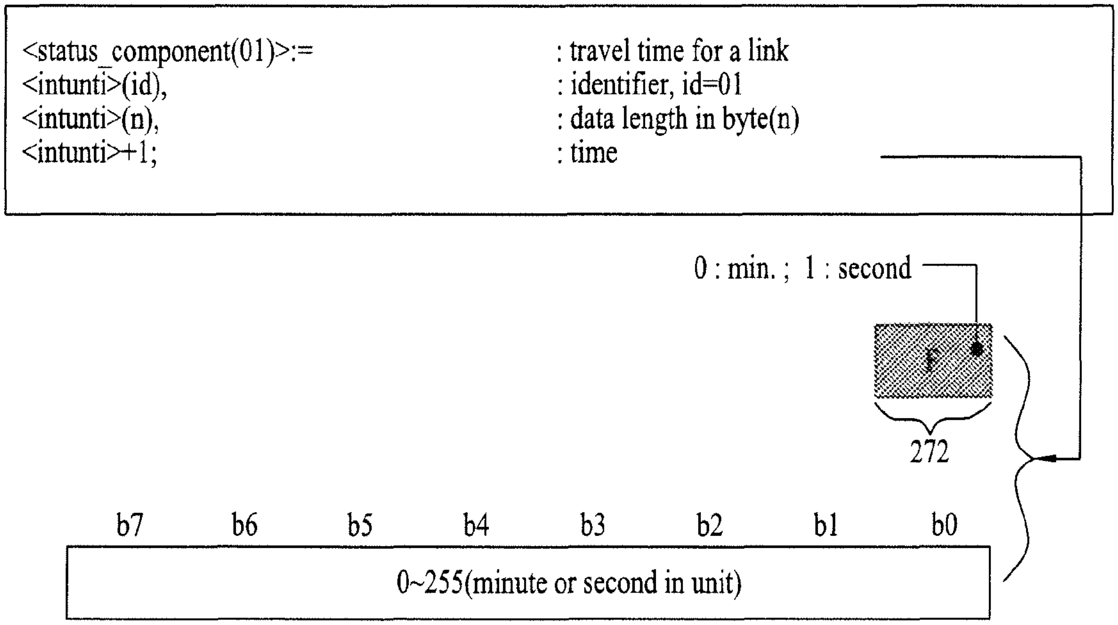

Additional bits may be assigned through a mechanism such as that shown by FIG. 5D. FIG. 5D is an implementation where a flag of one bit denoting time unit is appended.

In the implementation of FIG. 5D, the entire 8 bits are reserved for travel time for a link and an additional one bit flag 63 (e.g., this flag is set to 0 when the time unit corresponds to minute, whereas it is 1 when the time unit is second) is so assigned as to specify whether the time recorded in the 8 bits is expressed in minute or second. Since the travel time for the link is 25, 50, and 145 seconds from the previous three examples, 1:8 bits (flag: data) according to the implementation of FIG. 5D holds 1:00011001, 1:00110010, and 1:10010001, respectively. The error from each case becomes 0 in the present implementation, the error rate being reduced by 100% compared with the case expressed in minute.

Figure 5E:
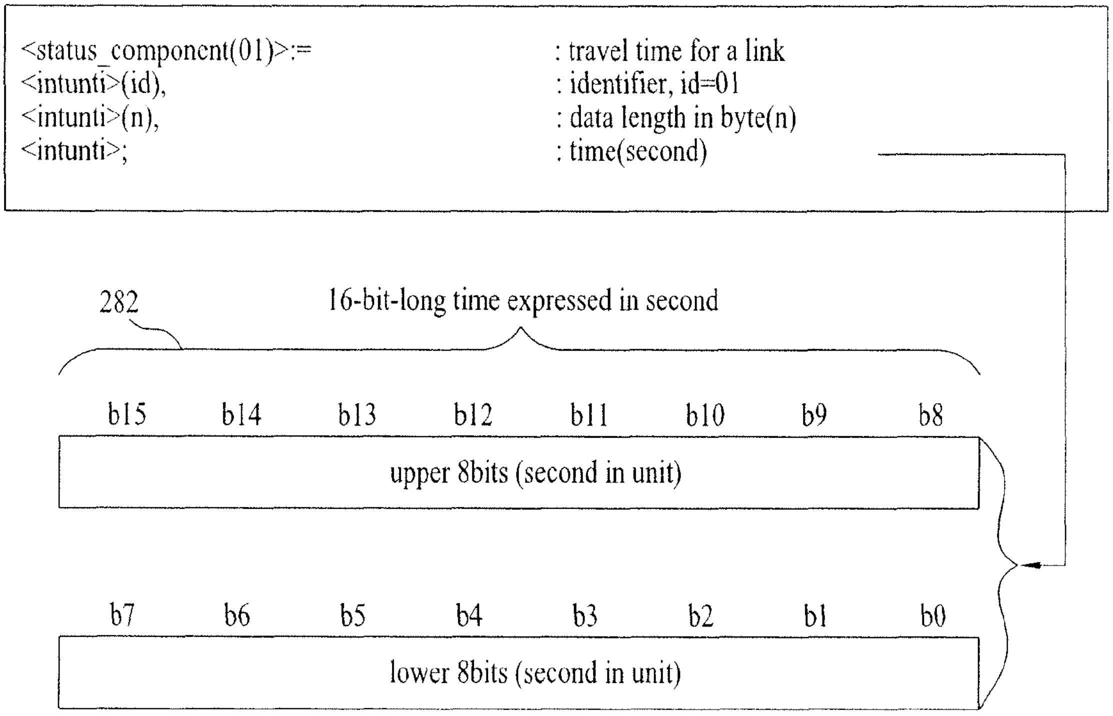

When the additional one bit does not make up 8 bits in such a way that effective information is carried in the other constituting 7 bits, the 7 bits may be wasted for the sake of simplicity for information processing. Therefore, when effective information is not included in the constituting 7 bits and thus delivered to the status component (ID 0x01), it may be useful to deliver the travel time for a link by 16 bits rather than to additionally deliver the one bit flag only, as shown in FIG. 5E ('intunli' in FIG. 5E denotes size of 16 bits). In the implementation of FIG. 5E, the entire 16 bits represent the travel time for the link 64 expressed wholly in second. In the implementation of FIG. 5E where the entire 16 bits are used to express travel time for a link, the maximum allowable time becomes 18 hours 12 minutes and 16 seconds. This representation capacity can accommodate travel time for a link for nearly all links without error.

The implementations of FIGS. 5A through 5C, where travel time for a link is expressed with 8 bits, have improved features compared with the case where the 8 bits are used to express the travel time for the link in units of minute only. However, for the implementations of FIGS. 5A and 5C, since the maximum allowable time for each case is 31 minutes and 50 seconds; and 42 minutes and 30 seconds, respectively, if a part of the link gets congested and travel time thus becomes elongated, a case where information delivery fails may happen due to the inability to represent the travel time for the link. For the implementation of FIG. 5B, a problem exists that as for the travel time for a link exceeding 127 seconds, an error happens identically to the case where the travel time for a link is delivered in units of minute. It may be particularly advantageous to employ the FIG. 5C-5E solutions when a larger range or a more precise range is required.

The above described traffic information data require a more stable receiving performance than the general audio and/or video data, i.e., the main data. In case of the main data, small errors that cannot be noticed by the eyes and ears of a user are not problematic. Conversely, in case of the traffic information data, even a 1-bit size error can cause a serious problem. Therefore, the traffic information data are processed with an additional coding process, which is then multiplexed with the main data and transmitted. Thus, robustness is provided to the traffic information data, such as the CTT data, thereby enabling the data to respond strongly against the channel environment which is always under constant and vast change. At this point, system information is required in order to extract the traffic information data from the channel through which the traffic information data are transmitted and, then, to decode the extracted traffic information data. In some cases, the system information is referred to as service information. The system information may include channel information, event information, and so on.

In the preferred embodiment of the present invention, program specific information/program and system information protocol (PSI/PSIP) is applied as the system information. However, the present invention is not limited only to the example given in the description set forth herein. More specifically, if the system information corresponds to a protocol being transmitted in a table format may be applied to the present invention regardless of name of the system information. The PSI is an MPEG-2 system standard defined for classifying the channels and the programs. And, PSIP is an advanced television systems committee (ATSC) standard having channels and programs that can be classified.

Herein, the PSI may include a program association table (PAT), a conditional access table (CAT), a program map table (PMT), and a network information table (NIT). More specifically, the PAT corresponds to a special information that can be transmitted by a packet having a packet identification (PID) of '0'. The PAT transmits the corresponding PID information of the PMT and the corresponding PID information of the NIT for each program. The CAT transmits information on a paid broadcast system that is used by the transmitting end. The PMT transmits PID information of a transport stream packet to which the program identification number and separate bit sequences, such as video data and audio data configuring the corresponding program, are transmitted. The PMT also transmits PID information to which the PCR is transmitted. The NIT transmits information of the actual transmission network.

On the other hand, the PISP may include a virtual channel table (VCT), a system time table (STT), a rating region table (RRT), an extended text table (ETT), a direct channel change table (DCCT), a direct channel change selection code table (DCCSCT), an event information table (EIT), and a master guide table (MGT). The VCT transmits information on the virtual channel such as channel information for selecting the channel and a packet identification (PID) for receiving audio data and/or video data. More specifically, by parsing the VCT, PIDs of the audio data and video data corresponding to the broadcast program that is being transmitted through the channel along with the channel name, channel number, and so on. The STT transmits information on the current weather and time, and the RRT transmits information on the region and deliberation committee for program rating. The EIT transmits information on the events of a virtual channel (e.g., program title, program start time, etc.). The DCCT/DCCSCT transmits information associated with automatic channel change, and the MGT transmits version and PID information of each table within the PSIP.

Each table within the above-described PSI/PSIP includes a basic unit referred to as a "section", and at least one or more sections are combined to configure a table. For example, the VCT may be divided into 256 sections. Herein, a single section may carry a plurality of channel information. However, the information on the virtual channel is not divided into two or more sections. An example of multiplexing and transmitting a traffic information message and a table associated with a system information is given in the description of the present invention.

Figure 6:
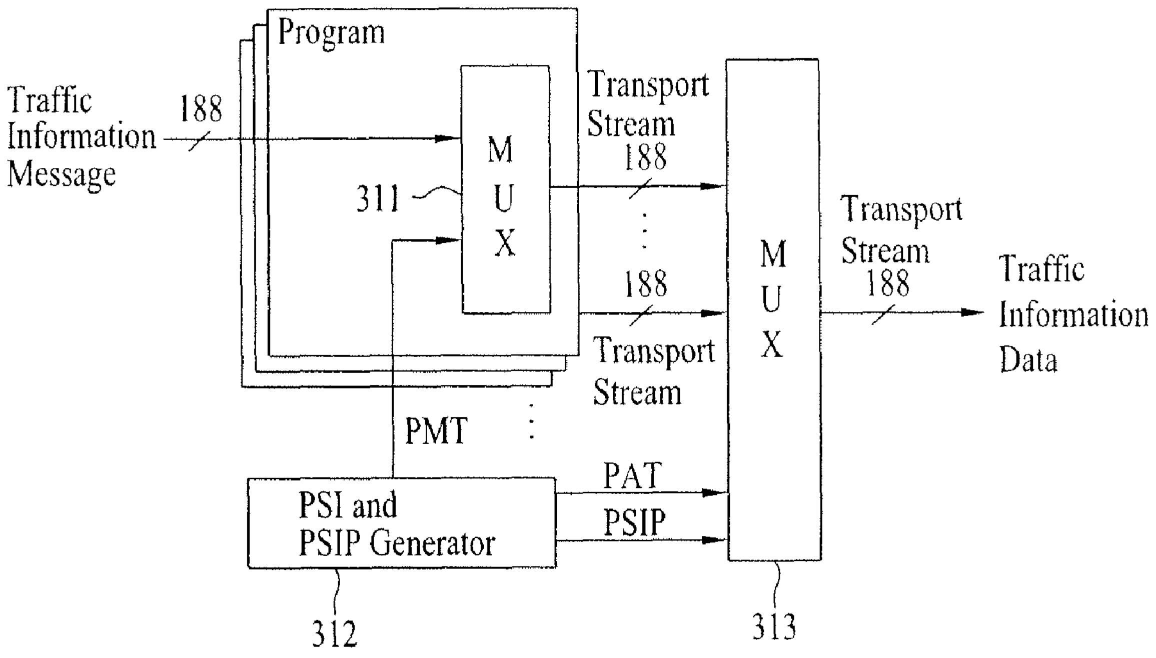
FIG. 6 illustrates a block view showing a general structure of a digital broadcast transmitting system according to an embodiment of the present.

FIG. 6 illustrates a block view showing a general structure of a digital broadcast transmitting system according to an embodiment of the present, wherein a traffic information message and a table associated with the system information are multiplexed and transmitted. Referring to FIG. 6, the transmitting system includes a first multiplexer 311, a PSI/PSIP generator 312, and a second multiplexer 313. More specifically, for example, the transmitting system may correspond to a broadcast station. In order words, the traffic information message is inputted to the first multiplexer 311 in a 188-byte transport stream (TS) packet unit. Herein, the traffic information message a traffic information application (e.g., a CTT application) that is to be transmitted.

The TS packet is configured of a header part and a payload part. Herein, the header part includes information indicating the beginning of the data and packet identification (PID) identifying the data part corresponding to the payload part. And, the payload part includes a traffic information message that is intended to be transmitted. At this point, the PID within the header part may either correspond to an identifier that can identify the data carried by the payload part as the traffic information message among the enhanced data, or correspond to an identifier that can identify the enhanced data. In case the PID of the header can identify the traffic information message, the traffic information message may be extracted from the TS packet. On the other hand, in case the PID of the header can identify the enhanced data, all TS packets identified as the enhanced data are received. Thereafter, the traffic information message is extracted from the received enhanced data. Furthermore, the TS packet which carries the traffic information message may correspond either to a packetized elementary stream (PES) type or to a section type. In other words, either a PES type traffic information message may be configured as the TS packet, or a section type traffic information message may be configured as the TS packet.

An example of the traffic information message being transmitted as the section type will be described in the present invention. In this embodiment of the present invention, the traffic information message is included in a digital storage media-command and control (DSM-CC) section, and the DSM-CC section is then configured as a 188-byte size TS packet. Herein, the identifier of the TS packet configuring the DSM-CC section is included in a data service table (DST). When transmitting the DST table, '0x95' is assigned as a stream_type field value within a service location descriptor of either the PMT or the VCT. More specifically, in the receiving system, when the stream_type field value of the PMT or VCT is equal to '0x95', this indicates that data broadcasting (i.e., enhanced data) including the traffic information data is being received. At this point, the traffic information data may be transmitted by a data carousel method. Herein, the data carousel method refers to repeatedly transmitting the same data periodically.

Meanwhile, the PSI/PSIP generator 312 is an example of a system information generator. The table that may be created by the PSI is at least one of PMT, PAT, CAT, and NIT. And, the table that may be created by the PSIP is at least one of VCT, STT, RRT, ETT, DCCT, DCCST, EIT, and MGT. The table created by the PSI/PSIP generator 312 includes a system information so that the receiving system may parse and decode the traffic information message. At this point, the receiving system may use only the tables within the PSI, or only the tables within the PSIP, or a combination of tables within both the PSI and the PSIP, so as to parse and decode the traffic information message. At least the PAT and PMT of the PSI and at least the VCT of the PSIP is required for parsing and decoding the traffic information message. For example, the PAT may include the system information transmitting the traffic information message and the PID of the PMT corresponding to the traffic information message (or program number). The PMT may include the PID of the TS packet transmitting the traffic information message. The VCT may include the PID of the TS packet transmitting the information of the virtual channel, which transmits the traffic information message, and the traffic information message.

Also, the present invention includes supplemental information associated with traffic information specifically indicating to which application the traffic information message belonged and information specifically indicating which information is included. The supplemental information associated with the traffic information may include service component identification information, application identification information, service information, and so on. The service information may include service name, service description, service logo, subscriber information, free text information, help information, and so on. Furthermore, such supplemental information may be included in a particular table within the PSI/PSIP either in a descriptor format or in a field format.

For simplicity of the description of the present invention, a descriptor including the supplemental information associated with the traffic information that is included in a particular table within the PSI/PSIP is referred to as a traffic information descriptor. Herein, the traffic information descriptor may also be referred to as a TPEG service descriptor. As described above, the term "traffic information descriptor" is only an example given to facilitate the understanding of the present invention. Therefore, any other term having the same function as the traffic information descriptor may also be applied herein. Moreover, in the description of the present invention, the particular table including the traffic information descriptor is defined as a traffic information providing table. Furthermore, the particular table including the traffic information descriptor is defined as a system information (SI) table wherein the traffic information descriptor is included.

FIG. 7 illustrates a syntax structure of traffic information descriptors according to an embodiment of the present invention. Referring to FIG. 7, the TPEG service descriptor may include a Descriptor tag field, a Descriptor_length field, a Number_of_TPEG_Service_Components field, and a 'for' loop repetition statement. Herein, the Number_of_TPEG_Service_Components field indicates the number of service components included in the TPEG service descriptor (or traffic information descriptor). And, the 'for' loop repetition statement is repeated as much as the value of the Number_of_TPEG_Service_Components field. The repetition statement may include a Service_Component_ID field, an Application_ID field, and a service information field.

More specifically, the Descriptor_tag field is an 8-bit field, which is given a value that can uniquely identify the TPEG service descriptor. In the example of the present invention, a value of 0xAC is given as the tag value of the TPEG service descriptor. However, this is only an example provided for an easier understanding of the present invention. Depending upon the design of the system designer, other kind of unused tag values may be allocated to the Descriptor_tag field. The Descriptor_length field is an 8-bit field, which indicates in byte units the length starting from the Descriptor_length field to the end of this field.

The Service_component_ID (SCID) field is also an 8-bit field, which indicates a value that can uniquely identify the service component within a service. The SCID field may be decided by the service provider. Herein, a single service component substantially corresponds to a single channel within the TPEG stream. The Application_ID field is a 16-bit field, which indicates a value that can uniquely identify each application. More specifically, a unique application identifier (AID) is assigned to each traffic information application, and a new AID is allocated whenever a new application is developed (or created).

The service information field within the repetition statement may include a Service_name field, a Service_description field, a Service_logo field, a Subscriber_information field, a Free_text_information field, and a Help_information field. The length of each field within the service information field is variable and is indicates in the form of at least one of a text sequence, numbers, and graphics. The Service_name field indicates the name of a service, which allows the user to identify a particular service. For example, a service name such as 'TPEG service of broadcast company A' may be included when the broadcast program is being transmitted. The Service_description field indicates a detailed description of the corresponding service. This field is for describing the service contents in more detail. For example, a service named "suburban public transportation information in the southern urban area" may be included and transmitted. The Service_logo field indicates a service logo, so as to allow a service or a service provider to be identified visually. The service logo is generally transmitted in a bitmap format or any other image format.

The Subscriber_information field indicates the subscriber information. For example, information such as a user fee for limited (or restricted) service components and payment information may be included and transmitted. The Free_text_information field indicates additional information that is to be transmitted to the user. For example, information on an interruption (or suspension) of a service, cancellation of a particular information, and so on, may be included and transmitted. And, the Help_information field indicates help information which the user can refer to. For example, information such as Internet addresses, telephone numbers, and so on may be included herein and transmitted.

The order, location, and meaning of each field shown in FIG. 7 are merely examples for facilitating the understanding of the present invention. And, since the order, location, and meaning of each field, and the number of field being additionally allocated can be adequately modified by anyone skilled in this field, the present invention is not limited only to the examples set forth herein. Also, in the example given in the present invention, the traffic information descriptor shown in FIG. 7 is included in at least one of the PMT of the PSI and the VCT of the PSIP and then transmitted.

More specifically, in the description of the present invention, an example of applying the PMT of the PSI and the VCT of the PSIP as the traffic information providing table. This indicates that the supplemental information associated with the traffic information may be transmitted through the PMT and/or VCT of the descriptor or the field. Similarly, when supplemental information associated with the traffic information is described in a field format, it is apparent that the fields can be applied to at least one of the tables of the PMT of the PSI and the VCT of the PSIP. Herein, the process of including the PMT and/or the VCT in the traffic information descriptor may be either mandatory or optional. Furthermore, whether the PMT and/or the VCT are/is mandatorily or optionally included is also merely an example of the present invention. Accordingly, the example does not limit the scope and spirit of the present invention.

FIG. 8 illustrates an example of table that may include the traffic information descriptors of FIG. 7. More specifically, FIG. 8 shows examples of the main descriptor types used in the PSI/PSIP table, the descriptor tag values allocated to each descriptor, and the PSI/PSIP tables using at least one of the above-described descriptors. Referring to FIG. 8, a service location descriptor indicated as 'S' must always exist in the VCT. More specifically, the service location descriptor carries the audio PID and video PID of a broadcast program. Also, in a corresponding service each of the descriptors must be included in the tables indicated as 'M (i.e., mandatory)' and may or may not be included in the tables indicated as 'O (i.e., optionally)'.

For example, AC-3 audio descriptor is given a value of 0x81 as the descriptor tag value and must indicate that it is used in the PMT and EIT. Furthermore, the TPEG service descriptor according to the example of the present invention is given a value of 0xAC the descriptor tag value and is marked as 'mandatory (M)' on the PMT and VCT. The above-described example is only proposed to simplify the description of the present invention. The TPEG service descriptor may also be marked as 'mandatory (M)' or 'optional (O)' on at least one of the PMT and VCT. The 0xAC value given as the TPEG service descriptor tag value is also only proposed as an example for facilitating the understanding of the present invention. Accordingly, depending upon the design of the system designer, other unused tag values may also be assigned herein.

FIG. 9 illustrates a syntax structure on a virtual channel table (VCT) wherein the traffic information descriptors of FIG. 7 are included according to an embodiment of the present invention. Herein, the syntax structure and its meaning correspond to those of a private section. The VCT syntax of FIG. 9 is configured by including at least one of a table_id field, a section_syntax_indicator field, a private_indicator field, a section_length field, a transport_stream_id field, a version_number field, a current_next_indicator field, a section_number field, a last_section_number field, a protocol_version field, and a num_channels_in_section field.

The VCT syntax further includes a first 'for' loop repetition statement that is repeated as much as the num_channels_in_section field value. The first repetition statement may include at least one of a short_name field, a major_channel_number field, a minor_channel_number field, a modulation_mode field, a carrier_frequency field, a channel_TSID field, a program_number field, an ETM_location field, an access controlled field, a hidden field, a service_type field, a source_id field, a descriptor_length field, and a second 'for' loop statement that is repeated as much as the number of descriptors included in the first repetition statement. Herein, the second repetition statement will be referred to as a first descriptor loop for simplicity. The descriptor descriptors( ) included in the first descriptor loop is separately applied to each virtual channel.

Furthermore, the VCT syntax may further include an additional_descriptor_length field, and a third 'for' loop statement that is repeated as much as the number of descriptors additionally added to the VCT. For simplicity of the description of the present invention, the third repetition statement will be referred to as a second descriptor loop. The descriptor additional_descriptors( ) included in the second descriptor loop is commonly applied to all virtual channels described in the VCT.

As described above, referring to FIG. 7, the table_id field indicates a unique identifier (or identification) (ID) that can identify the information being transmitted to the table as the VCT. More specifically, the table id field indicates a value informing that the table corresponding to this section is a VCT. For example, a 0xC8 value may be given to the table id field.

The version_number field indicates the version number of the VCT. The section_number field indicates the number of this section. The last_section_number field indicates the number of the last section of a complete VCT. And, the num_channel_in_section field designates the number of the overall virtual channel existing within the VCT section. Furthermore, in the first 'for' loop repetition statement, the short_name field indicates the name of a virtual channel. The major_channel_number field indicates a 'major' channel number associated with the virtual channel defined within the first repetition statement, and the minor_channel_number field indicates a 'minor' channel number. More specifically, each of the channel numbers should be connected to the major and minor channel numbers, and the major and minor channel numbers are used as user reference numbers for the corresponding virtual channel.

A virtual channel number is assigned to the traffic information message according to the present invention, and the traffic information message may be transmitted through the assigned virtual channel. In this case, the short name field indicates the name of the virtual channel through which the traffic information message is transmitted. The major_channel_number/minor_channel_number field the number of the virtual channel through which the traffic information message is transmitted. The program_number field is shown for connecting the virtual channel having an MPEG-2 program association table (PAT) and program map table (PMT) defined therein, and the program_number field matches the program number within the PAT/PMT. Herein, the PAT describes the elements of a program corresponding to each program number, and the PAT indicates the PID of a transport packet transmitting the PMT. The PMT described subordinate information, and a PID list of the transport packet through which a program identification number and a separate bit sequence, such as video and/or audio data configuring the program, are being transmitted.

The source_id field indicates a program source connected to the corresponding virtual channel. Herein, a "source" refers a particular source such as a video image, data or sound. The value of the source_id field corresponds to a unique value within the transport stream, which transmits the VCT. In an example according to the present invention, the traffic information descriptor describing the supplemental information associated with traffic information (i.e., supplemental information associated with the CTT) is included in the first descriptor loop. As described above in the description of the VCT, it is apparent that anyone skilled in the art can apply the example given in the present invention to other tables.

According to the present invention, there are two different methods of defining the PID of the VCT, which includes the traffic information descriptor. Herein, the PID of the VCT is a packet identifier (PID) required for identifying (or distinguishing) the VCT from the other tables. In the first method, the PID of the VCT according to the present invention may be set to depend upon the MGT. In this case, the receiving system cannot directly identify (or verify) the plurality of tables of the PSIP or PSI. Therefore, the VCT can be read only after the PID defined by the MGT is checked. Herein, the MGT is a table defining the PID, size, version number, and so on, of the plurality of tables. In the second method, the PID of the VCT according to the present invention may be set to have a base PID value (i.e., a fixed PID value) that is independent from the MGT. Unlike the first method, the second method is more advantageous in that the VCT can be identified without having to verify every single PID of the MGT. Evidently, the agreement on the base PID should precede the transmitting system and the receiving system.

As described above, the PAT, PMT, VCT, MGT, DCCT, and so on, describing the system information and supplemental information associated with traffic information are generated by the PSI/PSIP generator 312. Herein, the PMT is provided to the first multiplexer 311, and the remaining tables excluding the PMT (i.e., PAT, VCT, MGT, DCCT, and so on) are provided to the second multiplexer 313. The first multiplexer 311 multiplexes the traffic information message, which includes information on the traffic information application that is to be transmitted (e.g., CTT application), with the PMT, which is generated from the PSI/PSIP generator 312, to a 188-byte transport stream (TS) packet. Thereafter, the multiplexed message and table are outputted to the second multiplexer 313. The second multiplexer 313 multiplexes the output of the first multiplexer 311 with the tables outputted from the PSI/PSIP generator 312 to a 188-byte transport stream (TS) packet. Subsequently, the multiplexed message and table are outputted for additional coding.

An example of providing the PMT to the first multiplexer 311 and providing the remaining tables to the second multiplexer 313 is proposed in the description of the present invention. However, the present invention may also be designed to have a single multiplexer by integrating the first multiplexer 311 and the second multiplexer 313. The traffic information data that are outputted from the multiplexer of FIG. 6 for additional coding include a traffic information message and PSI/PSIP tables associated with the traffic information message multiplexed therein. Also, at least one of the above-described tables (e.g., PMT, VCT) may include a traffic information descriptor shown in FIG. 7.

Hereinafter, the coding and transmitting processes of the traffic information data will be described in detail according to first, second, and third embodiments of the present invention. By performing the additional coding process on the traffic information data, robustness can be provided to the traffic information data, such as the CTT data. Thus, the data can respond swiftly and appropriately to the channel environment that undergoes fast and frequent change.

First Embodiment

Figure 10:
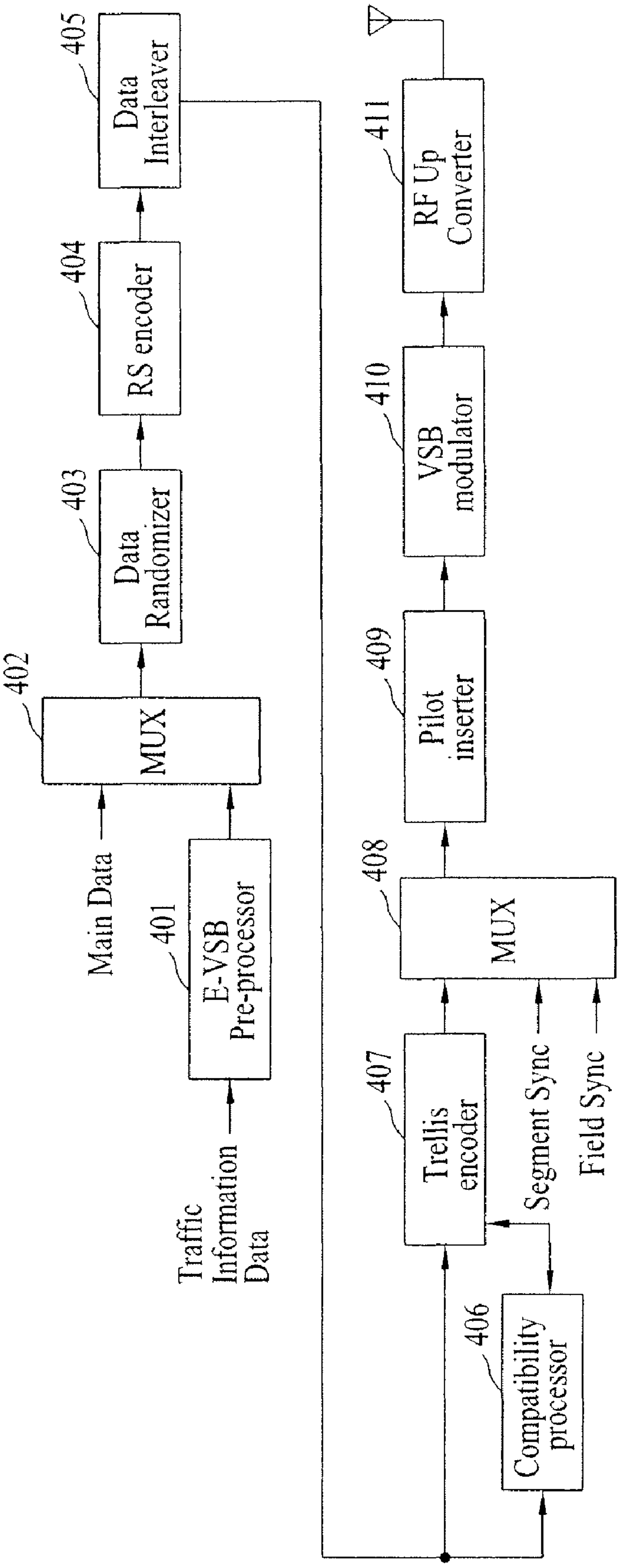
FIG. 10 illustrates a block view showing a structure of a digital broadcast transmitting system according to a first embodiment of the present invention.
Figure 11:
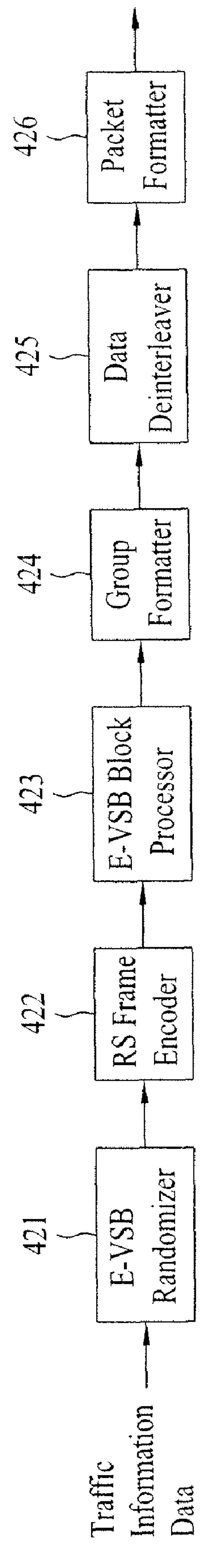
FIG. 11 illustrates an example of a detailed block view showing an E-VSB pre-processor of FIG. 10.

FIG. 10 illustrates a block view showing a structure of a digital broadcast transmitting system according to a first embodiment of the present invention. Referring to FIG. 10, the digital broadcast transmitting system includes an E-VSB pre-processor 401, a packet multiplexer 402, a data randomizer 403, a RS encoder 404, a data interleaver 405, a backward compatibility processor 406, a trellis encoder 407, a frame multiplexer 408, a pilot inserter 409, a VSB modulator 410, and a RF up-converter 411. Herein, as shown in FIG. 11, the E-VSB pre-processor 401 includes an E-VSB randomizer 421, a RS frame encoder 422, an E-VSB block processor 423, a group formatter 424, a data deinterleaver 425, and a packet formatter 426.

In the digital broadcast transmitting system having the above described structure, the main data are inputted to the packet multiplexer 402. On the other hand, the traffic information data are inputted to the E-VSB pre-processor 401, which performs additional coding processes so as to enable the traffic information data to respond quickly with robustness against noise and channel change. The E-VSB randomizer 421 of the E-VSB pre-processor 401 receives the traffic information data, thereby randomizing the received data and outputting the randomized data to the RS frame encoder 422. Herein, since the E-VSB randomizer 421 randomizes the traffic information data, the randomizing process of data randomizer 403 on the traffic information in a later process may be omitted.

The RS frame encoder 422 receives the randomized traffic information data and performs at least one of an error correction coding process and an error detection coding process on the received data. Accordingly, by providing robustness to the traffic information data, the data can scatter group error that may occur due to a change in the frequency environment. Thus, the data can respond appropriately to the frequency environment which is very poor and liable to change. The RS frame multiplexer 422 also includes a process of mixing in row units many sets of traffic information data each having pre-determined size. By performing an error correction coding process on the inputted traffic information data, the RS frame encoder 422 adds data required for the error correction and, then, performs an error detection coding process, thereby adding data required for the error detection process.

The error correction coding uses the RS coding method, and the error detection coding uses the cyclic redundancy check (CRC) coding method. When performing the RS coding process, parity data required for error correction are generated. And, when performing the CRC coding process, CRC data required for error detection are generated. More specifically, the RS frame encoder 422 identifies the traffic information data by units of a predetermined length (A). Then, a plurality of (A)-length units of traffic information data is grouped so as to form (or configure) a RS frame. Thereafter, an RS coding process is performed in at least one of a row direction and a column direction on the newly configured RS frame. In the present invention, the predetermined length unit (A) corresponds to 187 bytes.

If the inputted traffic information data correspond to a 188-byte unit MPEG transport stream (TS) packet, the first MPEG synchronization byte is removed, so as to form a 187-byte unit packet. Herein, the MPEG synchronization byte is removed because all traffic information data packets are given the same value. The MPEG synchronization byte may also be removed during the randomizing process on the E-VSB randomizer 421. In this case, the process of removing the MPEG synchronization byte performed by the RS frame encoder 422 is omitted. More specifically, if the inputted traffic information data does not include a fixed byte that can be removed, or if the length of the inputted packet is not 187 bytes, the inputted traffic information data is distinguished by 187-byte units. Thereafter, a plurality of 187-byte units of traffic information data is grouped so as to form (or configure) a RS frame. Thereafter, an RS coding process is performed in at least one of a row direction and a column direction on the newly configured RS frame.

Depending upon the channel situation between the transmission and the reception, an error may be included in the RS frame. When such error occurs, the CRC data (or CRC code or CRC checksum) may be used for checking whether an error exists by each row unit. In order to generate (or create) the CRC checksum, the RS frame encoder 422 performs CRC coding on the RS-coded traffic information data. The CRC checksum created by the CRC coding process may be used for notifying whether a damage has occurred by an error while the traffic information data are being transmitted through a channel. In the present invention, error detection coding method other than the CRC coding method may be used. Alternatively, an error correction coding method may be used in order to enhance the overall error correction ability of the receiving end.

The traffic information data sets RS-coded and CRC-coded, as described above, are outputted to the E-VSB block processor 423. The E-VSB block processor 423 codes the RS-coded and CRC-coded traffic information data at a coding rate of G/H (wherein G and H are integers, and $G<H$) and then outputs the G/H-rate coded data to the group formatter 424. For example, if 1 bit of the input data is coded to 2 bits and outputted, then G is equal to 1 and H is equal to 2 (i.e., $G=1$ and $H=2$). Alternatively, if 1 bit of the input data is coded to 4 bits and outputted, then G is equal to 1 and H is equal to 4 (i.e., $G=1$ and $H=4$).

An example performing a coding process at a coding rate of ½ (also referred to as a ½-rate coding process) or a coding process at a coding rate of ¼ (also referred to as a ¼-rate coding process) on the traffic information data is given in the description of the present invention. More specifically, in case of performing the ½-rate coding process, the E-VSB block processor 423 receives 1 bit and codes the received 1 bit to 2 bits (i.e., 1 symbol). Then, the E-VSB block processor 423 outputs the processed 2 bits (or 1 symbol). On the other hand, in case of performing the ¼-rate coding process, the E-VSB block processor 423 receives 1 bit and codes the received 1 bit to 4 bits (i.e., 2 symbols). Then, the E-VSB block processor 423 outputs the processed 4 bits (or 2 symbols). At this point, in case of performing the ¼-rate coding process, the symbol coded at a ½ coding rate may be repeated twice so as to output 2 symbols, or the input data may be coded twice at a ½ coding rate so as to output 2 symbols.

The ¼-rate coding process may provide more enhanced error correction ability, due to the higher coding rate as compared to the ½-rate coding process. For this reason, the data coded at a ¼ coding rate by the group formatter 424 in a later process are allocated to locations (or positions) in which the channel may affect the performance. On the other hand, the data coded at a ½ coding rate are allocated to locations having better performance. Thus, a difference in performance may be decreased. The above-mentioned ½-coding rate and ¼-coding rate are only exemplary embodiments proposed in the description of the present invention, and the coding rate may vary depending upon either the selection of the coded symbols or the number of repetition.

The group formatter 424 inserts the traffic information data outputted from the E-VSB block processor 423 in a corresponding area within a data group formed according to a pre-defined rule. Also, the group formatter 424 inserts various place holders related to data interleaving or known data sets to a corresponding area within the data group. At this point, the data group may be described by at least one hierarchical area.

And, depending upon the characteristic of each hierarchical area, the data type being allocated to each area may also vary.

Figure 12A:
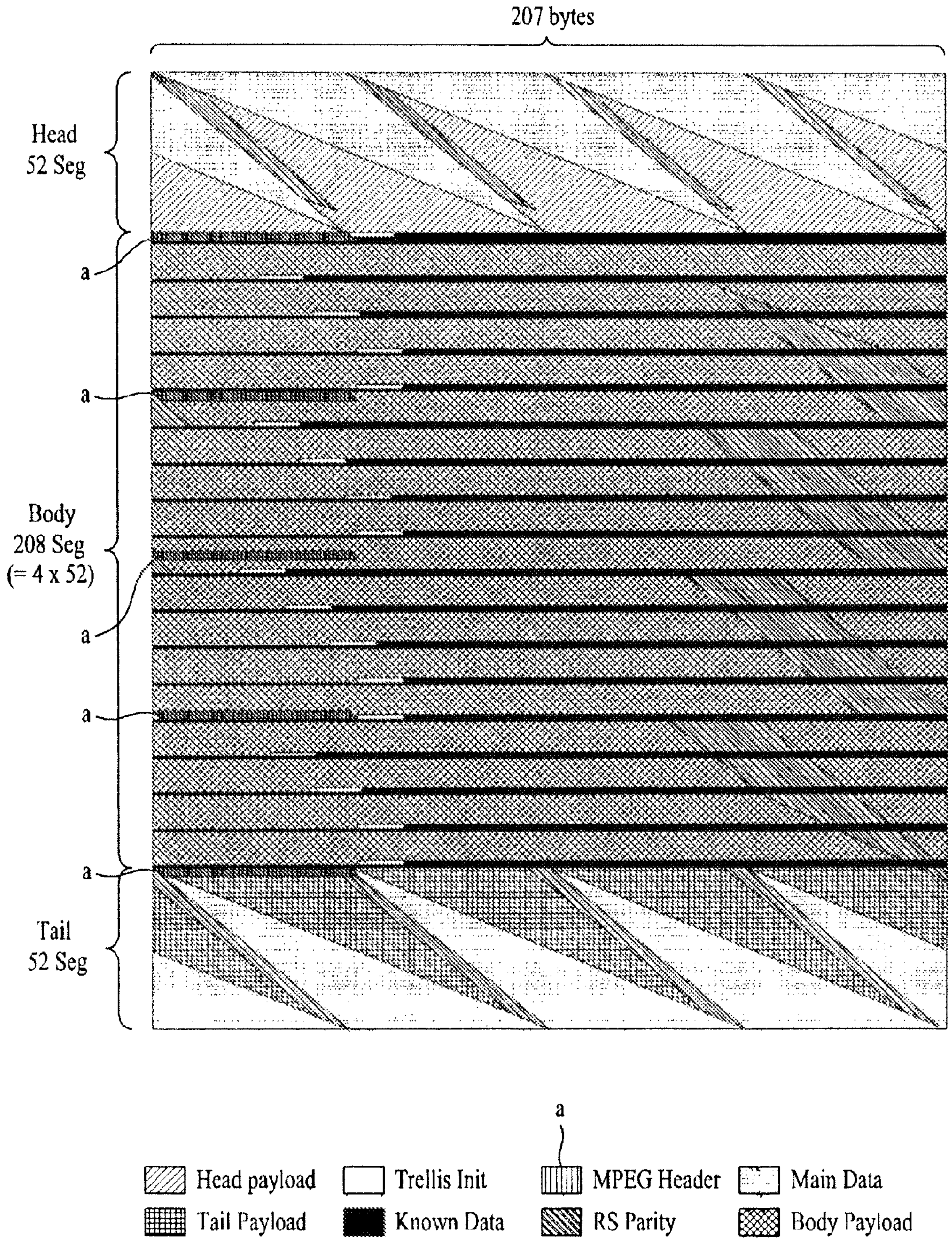
FIG. 12A and FIG. 12B each illustrates a data structure before and after a data deinterleaver of FIG. 10, respectively.

FIG. 12A illustrates a data structure of data groups prior to the data deinterleaving process, and FIG. 128 illustrates a data structure of data groups after the data deinterleaving process. FIG. 12A illustrates an example of a data group within a data structure prior to the data deinterleaving, the data group being divided into three hierarchical areas: a head area, a body area, and a tail area. Accordingly, in the data group that is inputted for the data deinterleaving process, data are first inputted to the head area, then inputted to the body area, and inputted finally to the tail area. The three areas described above are only exemplary to facilitate the understanding of the present invention. Depending upon the design of the system designer, the areas may be described in a smaller number of areas or a larger number of areas. Further, the data being inserted in each area may also vary. Therefore, the present invention is not limited only to the example proposed herein.

As described above, the head, body, and tail areas have been given as an example to simplify the description of the present invention. Additionally, in the example shown in FIG. 12A, the data group is set to have head, body, and tail areas so that the body area is defined as the area which is not mixed with the main data area within the data group. The data group is divided into a plurality of areas so that each area may be used differently. More specifically, the area that is not interfered by the main data has a highly resistant receiving performance as compared to the area that is interfered by the main data. Furthermore, when using a system inserting and transmitting the known data to the data group, and when a long and continuous set of known data is to be inserted periodically in the enhanced data, a predetermined length of known data may be periodically inserted in the body area. However, since the main data may be mixed in the head and tail areas, it is difficult to periodically insert the known data, and it is also difficult to insert a long and continuous set of known data.

Assuming that the data group is allocated to a plurality of hierarchical areas, as shown in FIG. 12A, the above-described E-VSB block processor 423 may code the data that are to be inserted in each area, according to the characteristic of each hierarchical area, at different coding rates. In the example of the present invention, the receiving system uses different coding rates based on areas in which it is assumed that performance may vary after performing an equalization process using channel information that may be used for channel equalization.

For example, the traffic information data that are to be inserted in the body area are ½-rate coded by the E-VSB block processor 423, and such ½-rate coded traffic information data are inserted to the body area by the group formatter 424. Additionally, the traffic information data that are to be inserted in the head and tail areas are ¼-rate coded by the E-VSB block processor 423. Herein, the ¼-rate coding provides greater error correction performance as compared to ½-rate coding. Thereafter, ¼-rate coded traffic information data are inserted to the head and tail areas by the group formatter 424. Alternatively, the traffic information data that are to be inserted in the head and tail areas may be coded by the E-VSB block processor 423 at a coding rate providing more efficient error correction performance. Subsequently, such coded traffic information data are inserted in the head and tail areas by the E-VSB block processor 423, or such coded data may be stored in a reserve area for future usage.

As shown in FIG. 12A, apart from the traffic information data coded and outputted from the E-VSB block processor 423, the group formatter 424 also inserts an MPEG header place holder, a non-systematic RS parity place holder, and a main data place holder in relation with the data deinterleaving. Referring to FIG. 12A, the main data place is allocated because the traffic information data and the main data are alternately mixed in the head and tail areas based upon the input of the data deinterleaver. In the output data that have been data deinterleaved, the place holder for the MPEG header is allocated to the very beginning of each packet.

Figure 12B:
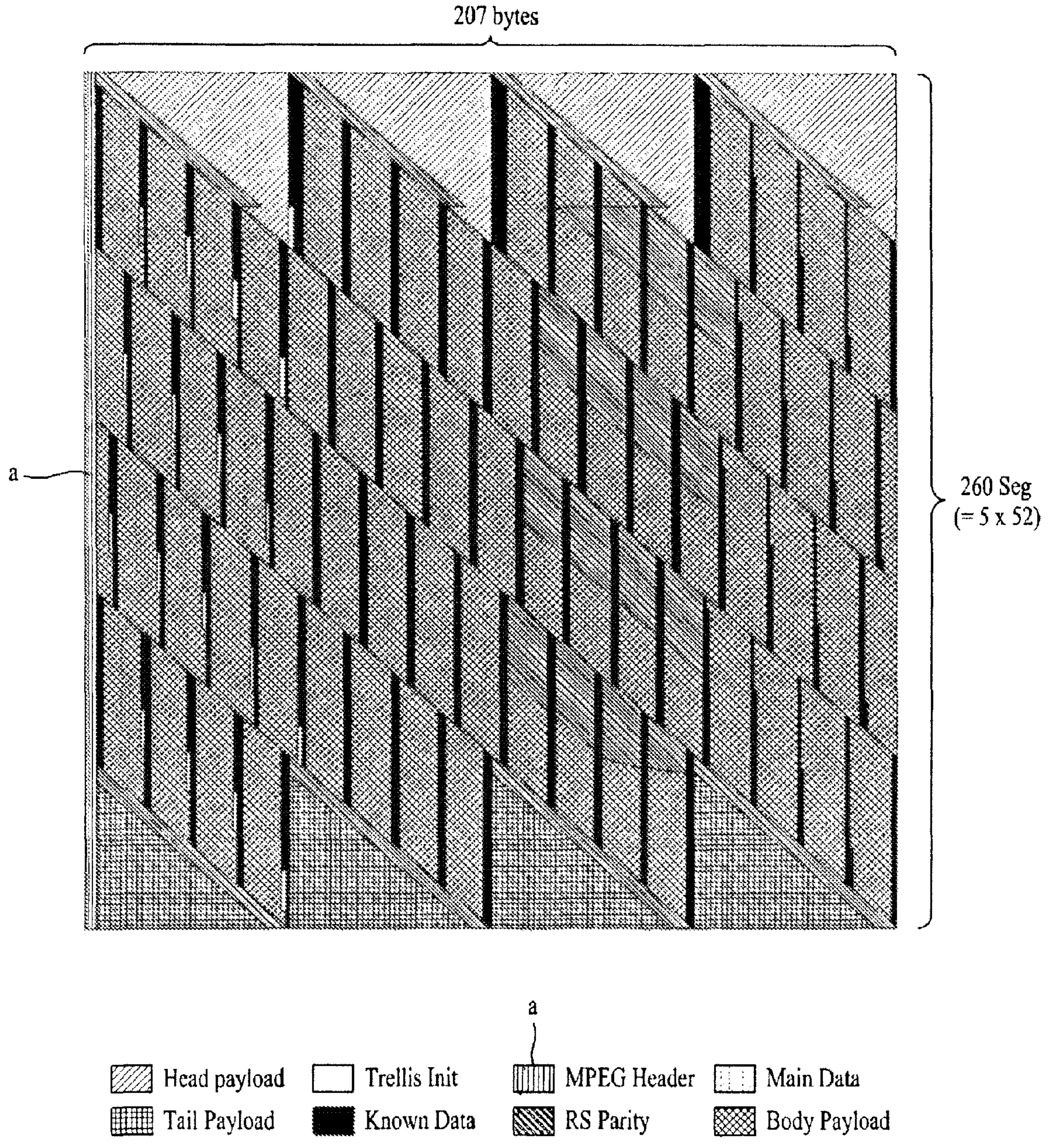

The group formatter 424 either inserts the known data generated by a pre-decided method in a corresponding area, or inserts a known data place holder in a corresponding area so as to insert the known data in a later process. Moreover, a place holder for initializing the trellis encoder 407 is inserted in the corresponding area. For example, the initialization data place holder may be inserted in front of the known data sequence. The output of the group formatter 424 is inputted to the data interleaver 425. The data deinterleaver 425 performs an inverse process of the data interleaver on the data within the data group and the place holder outputted from the group formatter 424. And, then, the data deinterleaver 425 outputs the deinterleaved data to the packet formatter 426. More specifically, when the data within the data group and the place holder the configuration shown in FIG. 12A are deinterleaved by the data deinterleaver 425, the data group being outputted to the packet formatter 426 has the structure (or configuration) shown in FIG. 12B.

Among the deinterleaved and inputted data, the packet formatter 426 removes the main data place holder and the RS parity place holder that have been allocated for the deinterleaving process. Then, the packet formatter 426 groups the remaining portion of the input data and inserts the remaining data to the 4-byte MPEG header place holder in the MPEG header. Furthermore, when the known data place holder is inserted by the group formatter 424, the packet formatter 426 may insert the known data in the known data place holder. Alternatively, the known data place holder may be directly outputted without any modification for the replacement insertion in a later process.

Thereafter, the packet formatter 426 configures the data within the data group packet that is formatted as described above, as a 188-byte unit traffic information data packet. Then, the packet formatter 426 provides the configured 188-byte unit traffic information data packet to the packet multiplexer 402. The packet multiplexer 402 multiplexes the 188-byte traffic information data packet and the main data packet outputted from the packet formatter 426 according to a predefined multiplexing method. Then, the multiplexed packets are outputted to the data randomizer 403. The multiplexing method may be altered or modified by various factors in the design of the system.

In a multiplexing method of the packet multiplexer 402, a traffic information data burst section and a main data section are distinguished (or identified) along a time axis, then the two sections are set to be repeated alternately. At this point, in the traffic information data burst section, at least one of the data groups may be transmitted, and only the main data may be transmitted in the main data section. In the traffic information data burst section, the main data may also be transmitted. When the traffic information data are transmitted in the above-described burst structure, the digital broadcast receiving system receiving only the traffic information data may turn on the power only during the data burst section. Alternatively, in the main data section whereby only the main data are transmitted, the power is turned off during the main data section, thereby preventing the main data from being received. Thus, excessive power consumption of the digital broadcast receiving system may be reduced or prevented. As described above, the packet multiplexer 402 receives the main data packet and the data group, which is outputted from the packet formatter 426, and transmits the received packets in a burst structure.

When the inputted data correspond to the main data packet, the data randomizer 403 performs a randomizing process identical to that of the conventional randomizer. More specifically, the MPEG synchronization byte within the main data packet is discarded (or deleted). Then, the remaining 187 bytes are randomized by using a pseudo random byte generated from within the data randomizer 403. Subsequently, the randomized data bytes are outputted to the RS encoder 404.

However, when the inputted data correspond to the traffic information data packet, the MPEG synchronization byte among the 4 bytes inserted in the traffic information data packet by the packet formatter 426 is discarded (or deleted) and only the remaining 3 bytes are randomized. The remaining portion of the traffic information data excluding the MPEG header is not randomized and outputted directly to the RS encoder 404. This is because a randomizing process has already been performed on the traffic information data by the E-VSB randomizer 421. The RS encoder 404 RS-codes the data randomized by the data randomizer 403 or the data bypassing the data randomizer 403. Then, the RS encoder 404 adds a 20-byte RS parity to the coded data, thereby outputting the RS-parity-added data to the data interleaver 405.

At this point, if the inputted data correspond to the main data packet, the RS encoder 404 performs a systematic RS-coding process identical to that of the conventional ATSC VSB system on the inputted data, thereby adding the 20-byte RS parity at the end of the 187-byte data. Alternatively, if the inputted data correspond to the traffic information data packet, each place of the 20 parity bytes is decided within the packet. Thereafter, the 20 bytes of RS parity gained by performing the non-systematic RS-coding are respectively inserted in the decided parity byte places. The data interleaver 405 receives the data having the parity added by the RS encoder 404 and interleaves the received data. Thereafter, the data interleaver 405 outputs the interleaved data to the backward compatibility processor 406 and the trellis encoder 407. Herein, the data interleaver 405 corresponds to a byte unit convolutional interleaver.

Meanwhile, a memory within the trellis encoder 407 should first be initialized in order to allow the output data of the trellis encoder 407 so as to become the known data defined based upon an agreement between the receiver and the transmitter. More specifically, the memory of the trellis encoder 407 should first be initialized before the known data sequence being inputted is trellis-encoded. At this point, the beginning of the known data sequence that is inputted corresponds to the initialization data place holder inserted by the group formatter 424 and not the actual known data. Therefore, a process of generating initialization data right before the trellis-encoding of the known data sequence being inputted and a process of replacing the initialization data place holder of the corresponding trellis encoder memory with the newly generated initialization data are required. This is to ensure the backward-compatibility with the conventional receiving system.

The trellis memory initialization data generated to replace the initialization data place holder are decided based upon the current status of the memory within the trellis encoder 407 and the desired initialization status. Further, due to the replaced initialization data, a process of recalculating the RS parity of the corresponding data packet and a process of replacing the newly calculated RS parity with the RS parity outputted from the data interleaver 405 are required. Therefore, the backward compatibility processor 406 receives the traffic information data packet including the initialization data place holder that is to be replaced with the initialization data from the data interleaver.

Subsequently, the backward compatibility processor 406 receives the initialization data from the trellis encoder 407. Then, the backward compatibility processor 406 calculates a new non-systematic RS parity and outputs the newly calculated non-systematic RS parity to the trellis encoder 407. Thereafter, the trellis encoder 405 selects the output of the data interleaver 405 as the data within the traffic information data packet including the initialization data place holder that is to be replaced. The trellis encoder 405 also selects the output of the backward compatibility processor 406. Accordingly, the trellis encoder 405 trellis-encodes the selected outputs by symbol units. More specifically, the trellis encoder 407 trellis-encodes the initialization data instead of the initialization data place holder included in the traffic information data packet which has been inputted.

Meanwhile, when the main data packet is inputted or when the traffic information data packet is inputted, wherein the traffic information data packet does not include the initialization data place holder that is to be replaced, the trellis encoder 407 selects the data outputted from the data interleaver 405 and the RS parity, thereby performing a trellis-encoding process by symbol units. Then, the data trellis-encoded by the trellis encoder 407 are inputted to the frame multiplexer 408. The frame multiplexer 408 inserts field and segment synchronization signals in the output of the trellis encoder 407 and outputs the processed data to the pilot inserter 409. The pilot inserter 409 adds a pilot signal to the output symbol sequence of the frame multiplexer 408. The pilot-added symbol sequence is modulated to a 8VSB signal of an intermediate frequency band and, then, converted to a RF band signal, thereby being transmitted through the antenna.

Meanwhile, the embodiment shown in FIG. 11 for the components and positioning of the components of the E-VSB pre-processor 401 is merely an example for the simplicity of the description of the present invention. According to a second embodiment of the present invention, the E-VSB pre-processor 401 includes a RS frame encoder, an E-VSB randomizer, an E-VSB block processor, a group formatter, a data interleaver, and a packet formatter. The difference between the second embodiment and the E-VSB pre-processor shown in FIG. 11 is the positioning order of the RS frame multiplexer and the E-VSB randomizer. More specifically, in the second embodiment of the present invention, RS frame coding is first performed on the traffic information data, and then the data randomizing process is performed. Apart from this detail, the remaining structure of the second embodiment is identical to the embodiment shown in FIG. 11. Therefore, a detailed description of the same will be omitted for simplicity.

In a third embodiment of the present invention, the E-VSB pre-processor 401 includes a RS frame encoder, an E-VSB randomizer, a group formatter, an E-VSB block processor, a data interleaver, and a packet formatter. The difference between the third embodiment and the E-VSB pre-processor shown in FIG. 11 is the positioning order of the RS frame multiplexer and the E-VSB randomizer and, also, the positioning order of the group formatter and the E-VSB block processor. More specifically, in E-VSB pre-processor according to the third embodiment of the present invention, RS frame coding is first performed on the traffic information data, and then the data randomizing and byte expansion processes are performed. Thereafter, group formatting, E-VSB block processing, data randomizing, and packet formatting processes are sequentially performed on the byte-expanded traffic information data.

In this case, since the group formatter is positioned before the E-VSB block processor, a byte expansion process needs to be performed before the group formatter in order to correspond to the coding process of the E-VSB block processor, thereby enabling the group formatter to operate without trouble. Therefore, the E-VSB randomizer not only randomizes the traffic information data but also performs byte expansion by inserting null data bits. Furthermore, the E-VSB block processor performs one of a ½-rate coding process and a ¼-rate coding process on only the valid data of the byte-expanded traffic information data, which correspond to the data bits having the actual information. As described above, the E-VSB pre-processor 401 performing additional coding processes on the traffic information data may be applied in various methods. Thus, the present invention is not limited only to the examples given in the description set forth herein.

Second Embodiment

Figure 13:
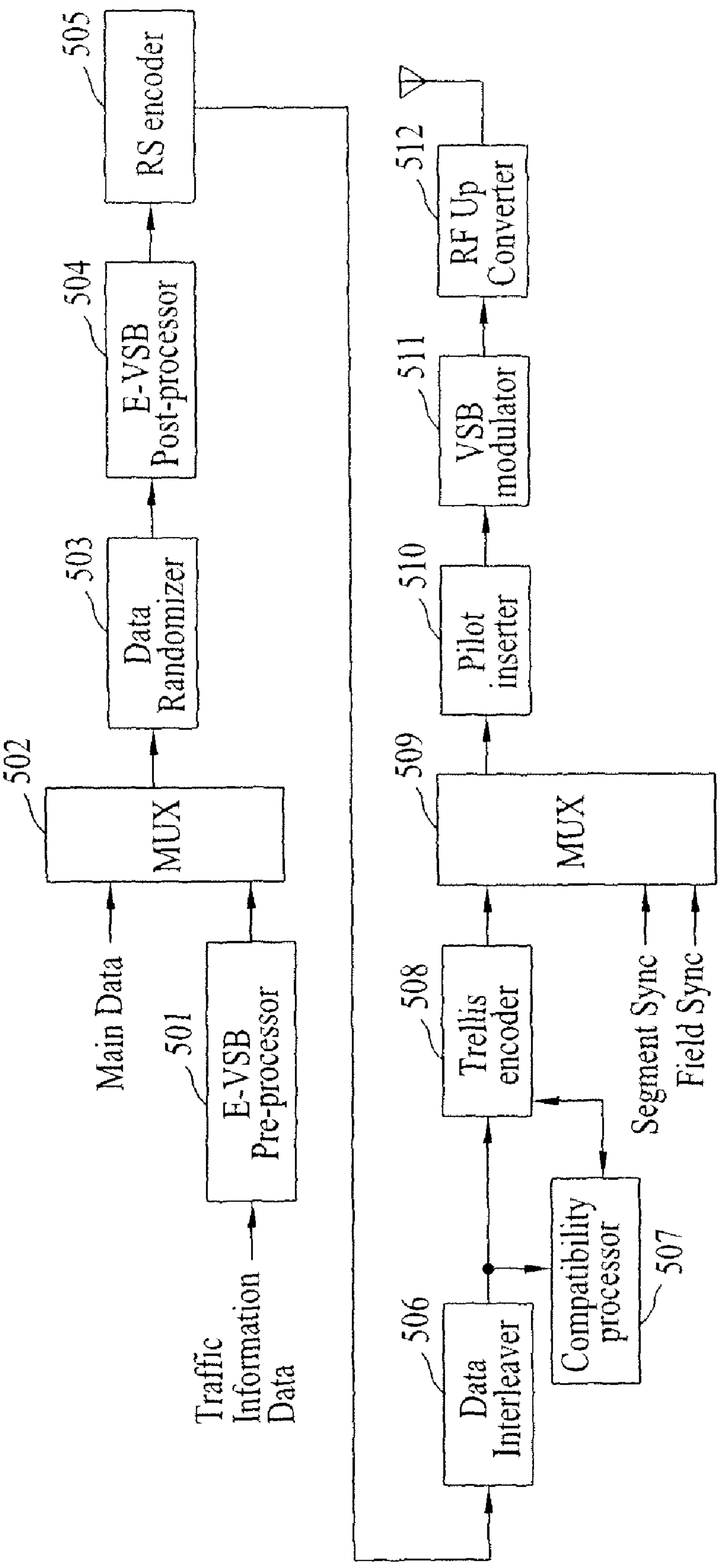
FIG. 13 illustrates a block view showing a structure of a digital broadcast transmitting system according to a second embodiment of the present invention.
Figure 14:
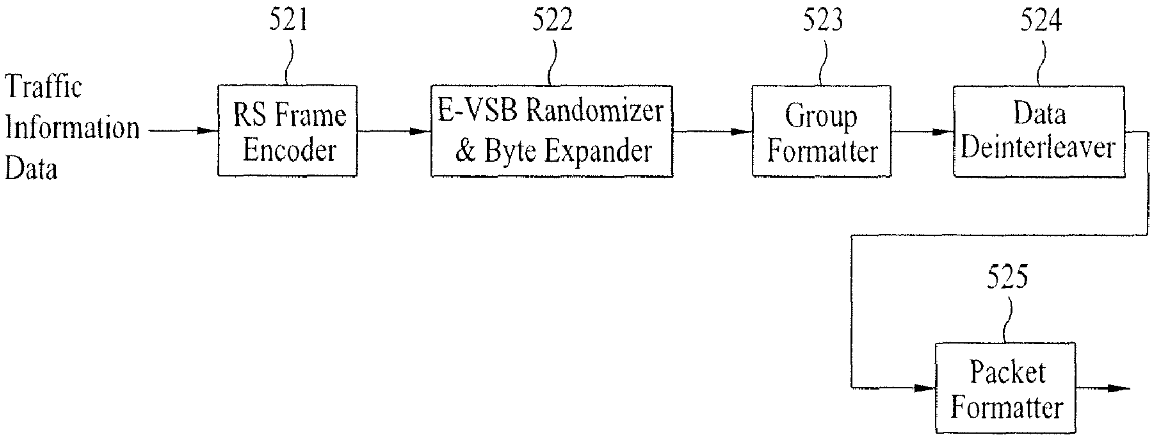
FIG. 14 illustrates an example of a detailed block view showing an E-VSB pre-processor of FIG. 13.
Figure 15:
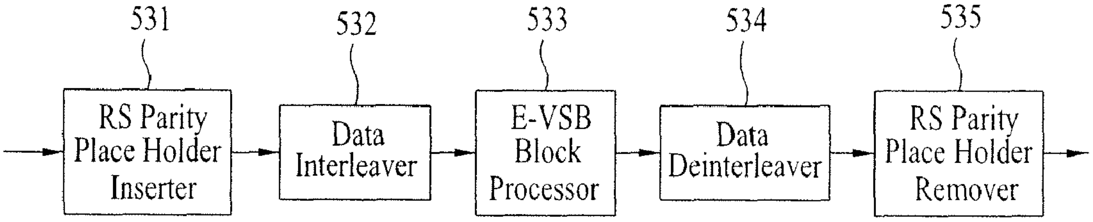
FIG. 15 illustrates an example of a detailed block view showing an E-VSB post-processor of FIG. 13.

FIG. 13 illustrates a block view showing a structure of a digital broadcast transmitting system according to a second embodiment of the present invention. Referring to FIG. 13, the digital broadcast transmitting system includes an E-VSB pre-processor 501, a packet multiplexer 502, a data randomizer 503, an E-VSB post-processor 504, a RS encoder 505, a data interleaver 506, a backward compatibility processor 507, a trellis encoder 508, a frame multiplexer 509, a pilot inserter 510, a VSB modulator 511, and a RF up-converter 512. Herein, as shown in FIG. 14, the E-VSB pre-processor 501 includes a RS frame encoder 521, an E-VSB randomizer 522, a group formatter 523, a data deinterleaver 524, and a packet formatter 525. Further, as shown in FIG. 15, the E-VSB post-processor 504 includes RS parity place holder inserter 531, data interleaver 532, an E-VSB block processor 533, data deinterleaver 534, and a RS parity place holder remover 535.

In the digital broadcast transmitting system according to the second embodiment of the present invention having the above described structure, the main data are inputted to the packet multiplexer 502. On the other hand, the traffic information data are inputted to the E-VSB pre-processor 501, which performs additional coding processes so as to enable the traffic information data to respond quickly with robustness against noise and channel change.

The RS frame encoder 521 of the E-VSB pre-processor 501 receives the randomized traffic information data and performs at least one of an error correction coding process and an error detection coding process on the received data. Accordingly, by providing robustness to the traffic information data, the data can scatter group error that may occur due to a change in the frequency environment. Thus, the data can respond appropriately to the frequency environment which is very poor and liable to change. The RS frame multiplexer 521 also includes a process of mixing in row units many sets of traffic information data each having pre-determined size. The error correction coding uses the RS coding method, and the error detection coding uses the cyclic redundancy check (CRC) coding method. When performing the RS coding process, parity data required for error correction are generated. And, when performing the CRC coding process, CRC data required for error detection are generated.

In the RS frame encoder 521, the process of creating the RS frame creating process and the process of performing error correction coding and error detection coding on the created RS frame are identical to those of the RS frame encoder 422 shown in FIG. 11. Therefore, a detailed description of the same will be omitted for simplicity. The traffic information data coded by the RS frame encoder 521 are inputted to the E-VSB randomizer/byte expander 522. The E-VSB randomizer/byte expander 522 receives the coded traffic information data and performs data randomizing and byte expansion processes thereon.

At this point, since the E-VSB randomizer/byte expander 522 already performs a randomizing process on the traffic information data, the process of randomizing the traffic information by the data randomizer 503 at a later end may be omitted for simplicity. Further, the order of performing the data randomizing process and the byte expansion process may be altered. More specifically, the byte expansion process may be performed after the data randomizing process. Alternatively, the data randomizing process may be performed after the byte expansion process. The order may be selected while taking into consideration the overall system and its structure.

The byte expansion may differ depending upon the coding rate of the E-VSB block processor 533 within the E-VSB post-processor 504. More specifically, when the coding rate of E-VSB block processor 533 is G/H, the byte expander expands G bytes to H bytes (wherein G and H are integers, and G<H). For example, if the coding rate if ½, 1 data byte is expanded to 2 data bytes. Alternatively, if the coding rate if ¼, 1 data byte is expanded to 4 data bytes. Then, the traffic information data outputted from the E-VSB randomizer/byte expander 522 is inputted to the group formatter 523. The operations of the group formatter 523, data deinterleaver 524, and the packet formatter 525 within the E-VSB pre-processor 501 are similar to those the group formatter 424, data deinterleaver 425, and the packet formatter 426 within the E-VSB pre-processor 401 shown in FIG. 10. Therefore, a detailed description of the same will be omitted for simplicity.

The traffic information data packet pre-processed by the E-VSB pre-processor 501 is inputted to the packet multiplexer 502 so as to be multiplexed with the main data packet. The data multiplexed and outputted from the packet multiplexer 502 are data randomized by the data randomizer 503 and, then, inputted to the E-VSB post-processor 504. Herein, the operations of the packet multiplexer 502 and data randomizer 503 are identical to those shown in FIG. 10, and therefore a detailed description of the same will be omitted for simplicity. Hereinafter, the E-VSB post-processor 504 will now be described in detail.

More specifically, the data randomized by the data randomizer 503 or bypassing the data randomizer 503 are inputted the RS parity place holder inserter 531 of the E-VSB post-processor 504. When the inputted data correspond to a 187-byte main data packet, the RS parity place holder inserter 531 inserts a 20-byte RS parity place holder at the back of the 187-byte data, thereby outputting the processed data to the data interleaver 532. Alternatively, when the inputted data correspond to a 187-byte traffic information data packet, the RS parity place holder inserter 531 inserts a 20-byte RS parity place holder within the data packet in order to perform a non-systematic RS-coding process in a later end. Thereafter, in the remaining portion of the 187 byte places bytes are inserted in the traffic information data packet, which are then outputted to the data interleaver 532.

The data interleaver 532 performs a data interleaving process on the output of the RS parity place holder inserter 531 and, then, outputs the processed data to the E-VSB block processor 533. The E-VSB block processor 533 performs additional coding processes on the valid data among the traffic information data being outputted from data interleaver 532. For example, if 1 byte has been expanded to 2 bytes by inserting null bits between data bits from the E-VSB randomizer/byte expander 522, the E-VSB block processor 533 ½-rate codes only the valid data bit among the symbol configured of a null bit and a valid data bit and, then, outputs the processed data. On the other hand, if 1 byte has been expanded to 4 bytes by inserting null bits between data bits from the E-VSB randomizer/byte expander 522, the E-VSB block processor 533 ¼-rate codes only the valid data bit among the symbol configured of 3 null bits and 1 valid data bit and, then, outputs the processed data.

Either the main data or the RS parity place holder directly bypasses the E-VSB randomizer/byte expander 522. Also, the known data and the initialization data place holder may directly bypass the E-VSB randomizer/byte expander 522. In case of the known data place holder, the known data generated from the E-VSB block processor 533 may be outputted instead of the known data place holder. The data being coded, replaced, and bypassed from the E-VSB block processor 533 are inputted to the data deinterleaver 534. The data deinterleaver 534 performs an inverse process of the data interleaver 532, whereby a data deinterleaving process is performed on the input data, which are then outputted to the RS parity place holder remover 535.

The RS parity place holder remover 535 removes the 20-byte RS parity place holder inserted by the RS parity place holder inserter 531 for the operations of the data interleaver 532 and the data deinterleaver 534 and, then, outputs the processed data to the RS encoder 505. At this point, if the inputted data correspond to main data packet, the last 20 bytes of RS parity place holders are removed from the 207 bytes of the main data packet. Alternatively, if the inputted data correspond to the traffic information data packet, the 20 bytes of RS parity place holders are removed from the 207 bytes of the traffic information data packet in order to perform the non-systematic RS-coding process.

As another embodiment of the E-VSB post-processor 504, if the inputted data correspond to the 187-byte main data packet, the RS parity place holder inserter 531 may perform a systematic RS-coding process so as to insert a 20-byte RS parity at the end of the 187-byte main data. Accordingly, the RS parity place holder inserter 531 removes the last 20 bytes of RS parity from the 207 bytes of the main data packet. Meanwhile, the RS encoder 505, the data interleaver 506, the backward compatibility processor 507, the trellis encoder 508, the frame multiplexer 509, the pilot inserter 510, the VSB modulator 511, and the RF up-converter 512 which are provided behind the E-VSB post-processor 504 are identical to those shown in FIG. 10. Therefore, a detailed description of the same will be omitted for simplicity.

Third Embodiment

Figure 16:
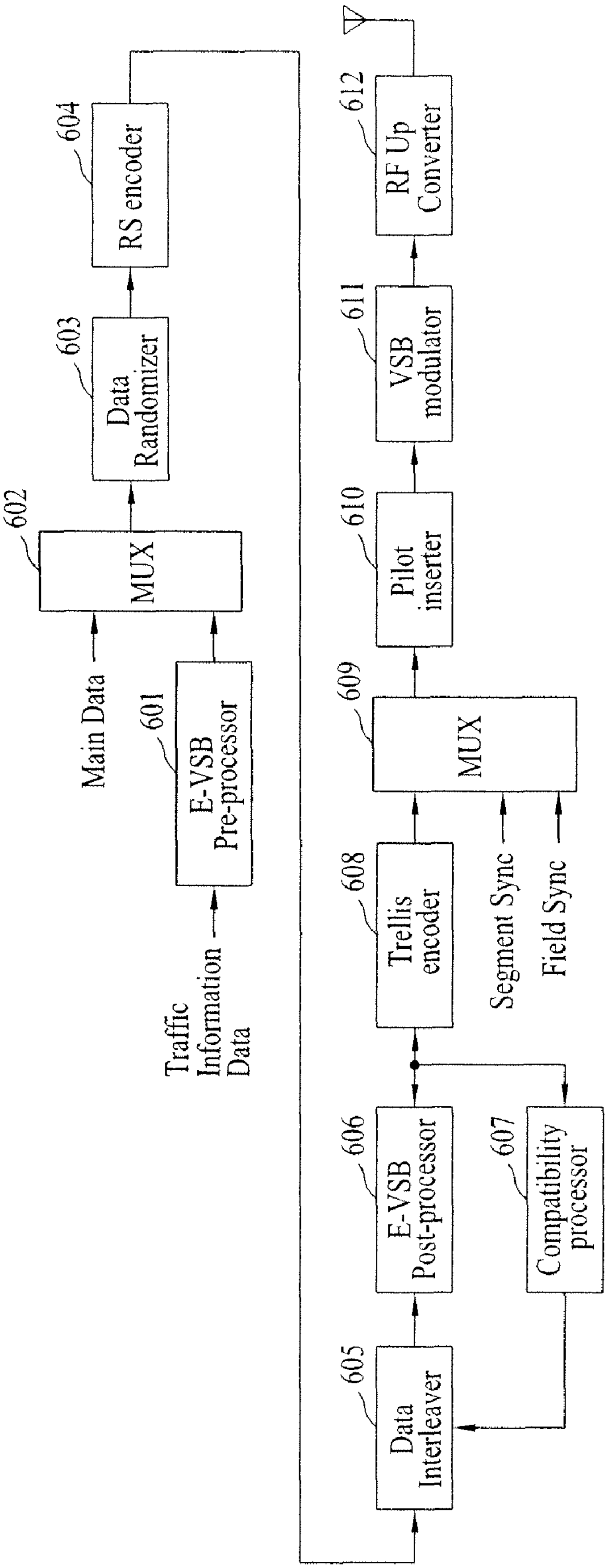
FIG. 16 illustrates a block view showing a structure of a digital broadcast transmitting system according to a third embodiment of the present invention.

FIG. 16 illustrates a block view showing a structure of a digital broadcast transmitting system according to a third embodiment of the present invention. Referring to FIG. 16, the digital broadcast transmitting system includes an E-VSB pre-processor 601, a packet multiplexer 602, a data randomizer 603, a RS encoder 604, a data interleaver 605, an E-VSB post-processor 606, a backward compatibility processor 607, a trellis encoder 608, a frame multiplexer 609, a pilot inserter 610, a VSB modulator 611, and a RF up-converter 612.

In the digital broadcast transmitting system according to the third embodiment of the present invention having the above described structure, the main data are inputted to the packet multiplexer 602. On the other hand, the traffic information data are inputted to the E-VSB pre-processor 601, which performs additional coding processes so as to enable the traffic information data to respond quickly with robustness against noise and channel change. The structure and operation of each component of the E-VSB pre-processor 601 are identical to those of the E-VSB pre-processor 501 shown in FIG. 14. Therefore, a detail description of the same will be omitted for simplicity.

The traffic information data packet pre-processed by the E-VSB pre-processor 601 is inputted to the packet multiplexer 602 so as to be multiplexed with the main data packet. The multiplexed data outputted from the packet multiplexer 602 are data randomized by the data randomizer 603 and, then, inputted to the RS encoder 604. The packet multiplexer 602 multiplexes the main data packet and the traffic information data packet according to a pre-defined multiplexing rule. At this point, the main data packet and the traffic information data packet may be multiplexed to have burst structures as shown in FIG. 10. Furthermore, if the traffic information data have been data randomized by the E-VSB pre-processor 601, then the data randomizing process on the traffic information data performed by the data randomizer 603 may be omitted.

The RS encoder 604 RS-codes the data being randomized from or bypassing the data randomizer 603, thereby adding a 20-byte RS parity and outputting the processed data to the data interleaver 605. At this point, if the inputted data correspond to the main data packet, the RS encoder 604 performs a systematic RS-coding process identical to that of the conventional ATSC VSB system on the input data, thereby adding a 20-byte RS parity at the end of the 187-byte data. Conversely, if the inputted data correspond to the traffic information data packet, the RS encoder 604 first decides 20 parity byte places and, then, performs a non-systematic RS-coding process on the decided parity byte places, thereby inserting the 20 bytes of non-systematic RS parity in the traffic information data packet.

The non-systematic coding process is performed on the traffic information data packet because, when the value of the traffic information data is changed by the E-VSB post-processor 606, the process of which will be described in detail in a later process, the RS parity is required to be recalculated. And, at this point, the parity bytes should be outputted later than the traffic information data bytes at the output end of the data interleaver 605. The data interleaver 605 receives the data having parity added thereto by the RS encoder 604. Then, after performing an interleaving process, the data interleaver 605 outputs the processed data to the E-VSB post-processor 606 and the backward compatibility processor 607. Herein, the data interleaver 605 receives the RS parity newly recalculated and outputted from the backward compatibility processor 607, thereby outputting the received RS parity instead of non-systematic RS parity which is not yet outputted.

The E-VSB post-processor 606 performs additional coding processes in symbol units only on the traffic information data being outputted from the data interleaver 605. For example, if 1 byte has been expanded to 2 bytes by inserting null bits between data bits from the E-VSB pre-processor 606, the E-VSB post-processor 606 ½-rate codes only the valid data bit among the symbol configured of a null bit and a valid data bit and, then, outputs the processed data. On the other hand, if 1 byte has been expanded to 4 bytes by inserting null bits between data bits from the E-VSB pre-processor 601, the E-VSB post-processor 606 ¼-rate codes only the valid data bit among the symbol configured of null bits and 1 valid data bit and, then, outputs the processed data.

The main data or the RS parity being outputted from the data interleaver 605 directly bypass (or bypasses) the E-VSB post-processor 606. Moreover, the known data and initialization data place holder also directly bypass (or bypasses) the E-VSB post-processor 606. At this point, the known data place holder may be replaced with the known data generated from the E-VSB post-processor 606 and then outputted. Furthermore, the E-VSB post-processor 606 generates initialization data so as to initialize the memory within the trellis encoder 608 to a decided status at the beginning of a known data sequence. Thereafter, the initialization data generated from the E-VSB post-processor 606 is outputted instead of the initialization data place holder. Accordingly, the value of the memory within the trellis encoder 608 should be received from the E-VSB post-processor 606.

The backward compatibility processor 607 calculates the 20-byte non-systematic RS parity corresponding to the traffic information data packet configured on 187 data bytes and outputted from the E-VSB post-processor 606. Subsequently, the calculated non-systematic RS parity is outputted to the data interleaver 605. The data interleaver 605 receives the RS parity bytes calculated and outputted from the backward compatibility processor 607 and, then, outputs the received RS parity bytes instead of the non-systematic RS parity. Herein, the backward compatibility processor 607 performs a non-systematic RS-coding process because the E-VSB post-processor 606 changes the values of the traffic information data and the initialization data place holder. Accordingly, when a decoding process is performed by the conventional ATSC VSB receiver, a decoding error may be prevented. In other words, this process is performed to provide backward compatibility to the conventional ATSC VSB receiver.

The data that are additionally coded and replaced by the E-VSB post-processor 606 and that bypass the E-VSB post-processor 606 are inputted to the trellis encoder 608 so as to be trellis-encoded. Thereafter, the trellis-encoded data sequentially pass through the frame multiplexer 609, the pilot inserter 610, the VSB modulator 611, and the RF up-converter 612. Meanwhile, according to another embodiment of the present invention, initialization data, which are generated for initializing a memory within the trellis encoder 608, are generated from the trellis encoder 608 instead of the E-VSB post-processor 606. In this case, the backward compatibility processor 607 receives a traffic information data packet from the E-VSB post-processor 606 in order to calculate the parity value. Herein, the traffic information data packet includes an initialization data place holder that is to be replaced by the initialization data. Further, the backward compatibility processor 607 receives the initialization data from the trellis encoder 608. Thereafter, the calculated non-systematic RS parity is outputted to the trellis encoder 608. The remaining processes that may follow are identical to those shown in FIG. 10. Therefore, a detailed description of the same will be omitted for simplicity. Furthermore, the frame multiplexer 609, the pilot inserter 610, the VSB modulator 611, and the RF up-converter 612 are also identical to those shown in FIG. 10. Therefore, a detailed description of the same will also be omitted for simplicity.

Figure 17:
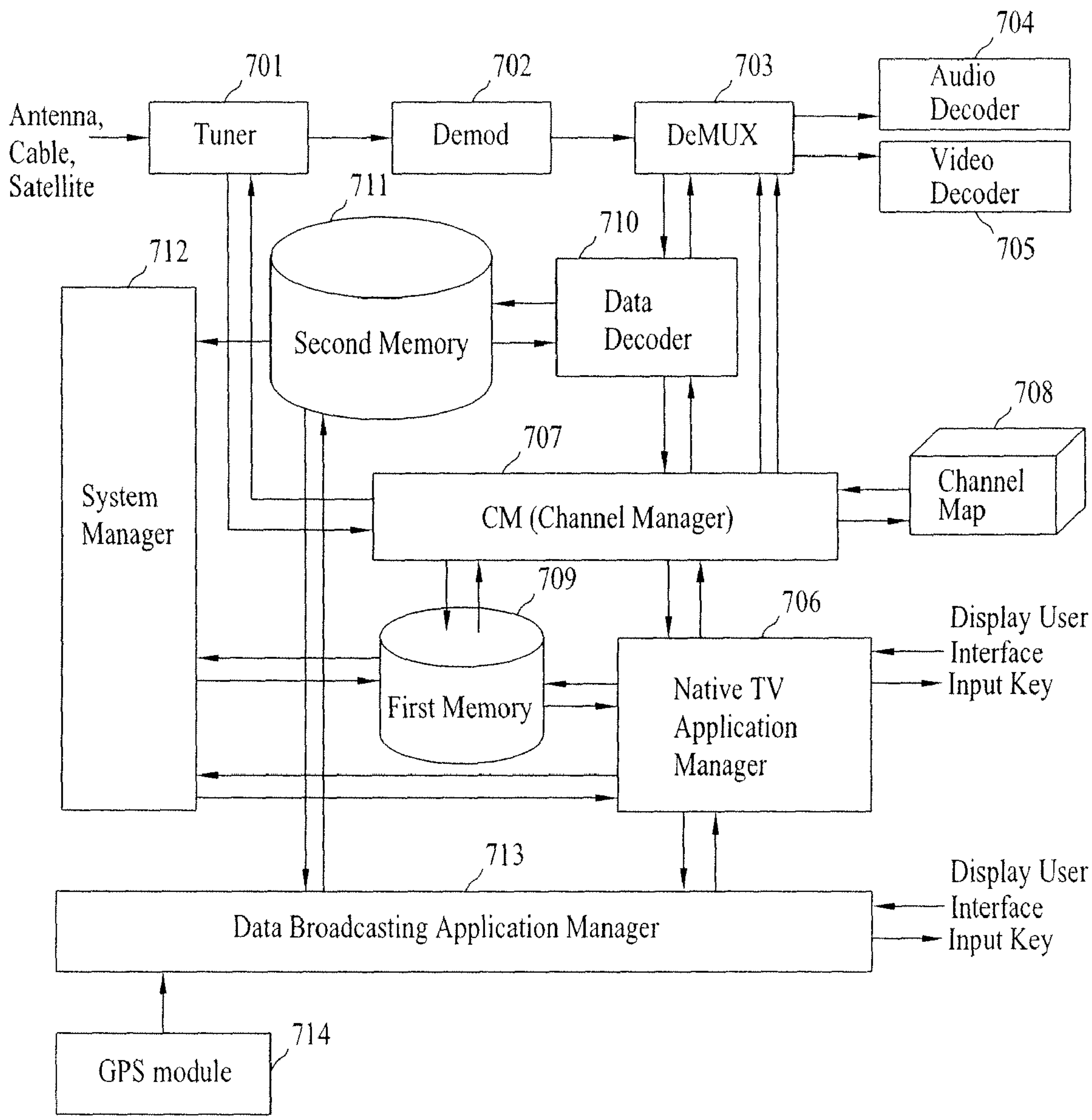
FIG. 17 illustrates a block view of a digital broadcast receiving system according to an embodiment of the present invention.

FIG. 17 illustrates a block view of a digital broadcast receiving system according to an embodiment of the present invention. More specifically, FIG. 17 illustrates a block view showing an example of a digital broadcast receiving system that can receive traffic information data being transmitted from a transmitting system and that demodulates and equalizes the received data, thereby recovering the processed data to its initial state. Referring to FIG. 17, the receiving system includes a tuner 701, a demodulator 702, a demultiplexer 703, an audio decoder 704, a video decoder 705, a native TV application manager 706, a channel manager 707, a channel map 708, a first memory 709, a data decoder 710, a second memory 711, a system manager 712, a data broadcasting application manager 713, and a GPS module 714. Herein, the first memory 709 corresponds to a non-volatile memory (NVRAM) (or a flash memory).

The tuner 701 tunes a frequency of a particular channel through any one of an antenna, a cable, and a satellite, thereby down-converting the tuned frequency to an intermediate frequency (IF) signal. Thereafter, the down-converted signal is outputted to the demodulator 702. At this point, the tuner 701 is controlled by the channel manager 707. The result and strength of the broadcast signal corresponding to the tuned channel are reported to the channel manager 707. Herein, the data being received through the frequency of a particular channel include the main data, the enhanced data, and the table data which are used for decoding the main data and enhanced data. In the example given in the present invention, traffic information data and a traffic information providing table may be applied to the enhanced data.

The demodulator 702 performs VSB demodulation and channel equalization processes on the signal outputted from the tuner 701. Then, after identifying the main data and the traffic information data from the signal, the demodulator 702 outputs the data (or signal) by TS packet units. The structure and operation of the demodulator 702 will be described in detail in a later process. In the example of the present invention, only the traffic information data packet outputted from the demodulator 702 is inputted to the demultiplexer 703. In other words, the main data packet may be inputted to another demultiplexer (not shown) that processes main data packets. Furthermore, the present invention may also be designed in a way that the demultiplexer 703 also demultiplexes the enhanced data packet as well as the main data packet. In the description of the present invention, the receiving and processing of traffic information data are described in detail. And, it should be noted that a detailed description of the processing of main data starting from the demultiplexer 703 may be omitted.

The demultiplexer 703 demultiplexes the traffic information messages and the PSI/PSIP tables from the traffic information data packets being inputted based upon the control of the data decoder 710. Thereafter, the demultiplexed traffic information messages and PSI/PSIP tables are outputted to the data decoder 710 in a section format. In an example given in the present invention, a traffic information message carried by a payload within the TS packet is outputted in a DSM-CC section format. At this point, the demultiplexer 703 performs a section filtering process based upon the control of the data decoder 710 so as to delete duplicate sections and to output only the non-duplicate sections to the data decoder 710. Moreover, the demultiplexer 703 may output the section configuring a desired table (e.g., VCT) through a section filtering process to the data decoder 710. Herein, the VCT includes traffic information descriptors shown in FIG. 7. The traffic information descriptors may also be included in the PMT.

The section filtering method includes a method of initiating section filtering after verifying the PID of a table defined by the MGT (e.g., VCT), and, when the VCT has a fixed PID (i.e., a base PID), a method of initiating section filtering without verifying the MGT. At this point, the demultiplexer 703 performs section filtering by referring to the table id field, the version number field, the section number field, and so on. The data decoder 710 parses the DSM-CC section configuring the demultiplexed traffic information message. Then, the data decoder 710 decodes the traffic information message being a result of the parsing process and, then stores the traffic information message in a database of the second memory 711. The data decoder 710 groups a plurality of sections having the same table identifiers (table_id) to configure and parse a table. Then, the data decoder 710 stores the system information being the parsed result in the database of the second memory 711.

The second memory 711 is a table and data carousel database storing system information parsed from the tables and traffic information messages parsed from the DSM-CC section. Whether or not a table is configured of a single section or a plurality of sections can be known by the table_id field, the section_number field, and the last_section_number field within the table. For example, grouping only the TS packets having the PID of the VCT becomes a section. On the other hand, grouping sections having table identifiers allocated to the VCT becomes the VCT.

When parsing the VCT, information on the virtual channel to which traffic information is transmitted may be obtained. In addition, supplemental information associated with the traffic information message described, as shown in FIG. 7, in the traffic information descriptors included in the VCT may also be obtained. More specifically, when parsing the traffic information descriptors, application identification information, service component identification information, service information (e.g., service name, service description, service logo, subscriber information, free text information, help information, etc.), and so on, of the traffic information message being transmitted to the corresponding virtual channel can be obtained.

The application identification information, service component identification information, and service information of the traffic information message obtained as described above may either be stored in the second memory 711 or outputted to the data broadcasting application manager 713. Additionally, reference may be made to the application identification information, service component identification information, and service information for decoding the traffic information message. Alternatively, the application identification information, service component identification information, and service information may also be used for preparing the operation of the application program for the traffic information message.

The data decoder 710 controls the demultiplexing of the system information table corresponding to the table associated with channel and event information. Thereafter, the data decoder 710 can transmit an A/V PID list to the channel manager 707. The channel manager 707 may refer to the channel map 708 to send a request (or command) for receiving an information table associated with the system, and then the channel manager 707 can receive the corresponding result. The channel manager 707 may also control the channel tuning of the tuner 701. Furthermore, the channel manager 707 directly controls the demultiplexer 703 so as to directly set up the A/V PID, thereby controlling the audio and video decoders 704 and 705.

The audio and video decoders 704 and 705 may respectively decode and output the audio and video data demultiplexed from the main data packet, or respectively decode and output the audio and video data demultiplexed from the traffic information data packet. Meanwhile, according to the embodiment of the present invention, it is apparent that when traffic information data and also audio data and video data are included in the enhanced data, the audio data and video data demultiplexed by the demultiplexer 703 may be respectively decoded by the audio decoder 704 and the video decoder 705. For example, the audio decoder 704 may decode the audio data by using an audio coding (AC)-3 decoding algorithm, and the video decoder 705 may decode the video data by using an MPEG-2 decoding algorithm.

Meanwhile, the native TV application manager 706 operates a native application program stored in the first memory 709, thereby performing general functions such as channel switching. The native application program refers to a software that is being mounted upon shipping of the receiving system. More specifically, when a user request is transmitted to the receiving system through a user interface (UI), the native TV application manager 706 the request onto the screen through a graphic user interface (GUI), thereby responding to the user request. The user interface receives the user request through an inputting device, such as a remote controller, a key pad, a jog dial, and a touch screen provided on the display screen. Thereafter, the user interface outputs the received user request to the native TV application manager 706, the data broadcasting application manager 713, and so on.

The native TV application manager 706 controls the channel manager 707, thereby controlling channel associated operations, such as managing the channel map 708 and controlling the data decoder 710. In addition, the native TV application manager 706 stores the GUI control of the general receiving system, the user request, and the status of the receiving system to the first memory 709, and also recovers the information stored in the first memory 709. The channel manager 707 controls the tuner 701 and the data decoder 710, thereby managing the channel map 708 so as to be able to respond to the channel request made by the user.

More specifically, the channel manager 707 sends a request to the data decoder 710 so that the table associated with the channel, which is to be tuned, can be parsed. Thereafter, the channel manager 707 receives a report on the parsing result of the corresponding table from the data decoder 710. Then, depending upon the reported parsing result, the channel manager 707 updates the channel map 708. The channel manager 707 also sets up a PID to the demultiplexer 703 so as to demultiplex the table associated with the traffic information message from the traffic information data. The system manager 712 controls booting of the receiving system by turning on and off the power and, then, stores a ROM image (including downloaded software images) to the first memory 709. In other words, the first memory 709 stores operation programs, such as operation system (OS) programs required for operating the receiving system, and application programs performing data service functions.

The application program is a program that processes the traffic information message stored in the second memory 711, thereby providing the traffic information service to the user. If a data broadcasting data type other than the traffic information data is stored in the second memory 711, the corresponding data are processed by the application program or another type of application program and, then, provided to the user. The operation program and application program stored in the first memory 709 may be updated or corrected with a newly downloaded program. Furthermore, since the stored operation program and application program are not deleted even when the driving power supply is shut down, when the driving power is supplied, the program can be performed without having to download a new program.

The application program for providing the traffic information service according to the present invention may be mounted in the first memory 709 upon shipping of the receiving system, or stored later on in the first memory 709 after being downloaded. Also, the application program for the traffic information service (i.e., traffic information providing application program) that is stored in the first memory 709 can be deleted, updated, and corrected. Furthermore, the traffic information providing application program may also be downloaded along with the traffic information data and executed each time the traffic information data are being received.

When a data service request is made through the user interface, the data broadcasting application manager 713 operates the corresponding application program stored in the first memory 709 so as to process the requested data, thereby providing the requested data service to the user. And, in order to provide such data service, the data broadcasting application manager 713 supports the GUI. Herein, the data service is provided in the form of text, voice, graphic, still image, motion picture, and so on. The data broadcasting application manager 713 may be provided with a platform for executing the application program stored in the first memory 709. The platform may be, for example, a Java virtual machine for executing a Java program.

Hereinafter, an example of providing traffic information service to the user by having the data broadcasting application manager 713 execute the traffic information providing application program stored in the first memory 709 and, then, process the traffic information message stored in the second memory 711 will now be described in detail. The traffic information service according to the present invention is provided to the users by a receiver having only one or none of an electronic map and a GPS mounted therein in the form of at least one of a text, a voice, a graphic, a still image, and a motion picture. If the GPS module 714 is mounted on the receiving system shown in FIG. 13, the GPS module 714 receives satellite signals transmitted from a plurality of low earth orbit satellites so as to extract a current location information (i.e.,. longitude, latitude, altitude), thereby outputting the extracted information to the data broadcasting application manager 713. At this point, it is assumed that the electronic map including information on each link and node and the various graphic information are stored in a storage unit (or memory) other than the first memory 709 or the second memory 711.

By executing the traffic information providing application program, the data broadcasting application manager 713 provides the traffic information service requested by the user based upon the current location information acquired from the GPS module 714 and the traffic information message stored in the second memory 711. More specifically, based upon the request of the data broadcasting application manager 713, the traffic information message stored in the second memory 711 is read and inputted to the data broadcasting application manager 713. The data broadcasting application manager 713 analyses the traffic information message read from the second memory 711, thereby extracting required information and/or control signals in accordance with the contents of the message. In the description of the present invention, it is assumed that a request for a CTT service has been made by the user.

More specifically, the data broadcasting application manager 713 extracts a message ID (i.e., a message component), a message generation time, a message transmission time from the message management container 102 of each traffic information message (or TPEG message), such that it determines whether the following container is equal to a CTT-status container on the basis of information of the message component. In this case, the message component information includes a message ID and a version number. Also, the message component is requisite for all messages and is adapted to manage the messages of the data broadcasting application manager 713.

If the following container is determined to be the CTT-status container 104, the data broadcasting application manager 713 acquires (or obtains) information from the CTT status component of the CTT status container 104. The data broadcasting application manager 713 acquires (or obtains) from the TPEG location container 106 a location information corresponding to a currently-transmitted traffic-carrying information. In this case, the location information may be location coordinates (latitude and longitude) of start and end points or a link of the start and end points according to location type information of the TPEG location container. In other words, the location information may be a link ID assigned to a road section (i.e., a road link). Whenever necessary, a section may be specified as a link corresponding to the received information by referring to link- or node-information stored in the second memory 711.

Provided that the location type information is a link ID, and the location information is text data (e.g., a road name) associated with the link ID or a link, the present invention can specify a link corresponding to the received traffic-carrying status information by referring to the corresponding link information. If the location information acting as a link ID is a code for defining the link ID, the present invention can specify a link corresponding to the received traffic-carrying status information by referring to the corresponding link system stored in the second memory 711.

In the meantime, the data broadcasting application manager 713 reads data of an electronic map from the second memory 711 on the basis of current location coordinates received from the GPS module 714, and displays the read electronic map data on a display screen. In this case, a specific graphic sign is displayed at a specific point corresponding to the current location. Under the above-mentioned situation, the data broadcasting application manager 713 receives average link speed information, such that the received information is displayed at specific location coordinates of a location container following the container equipped with the average link speed information or at a link corresponding to a link ID. For the above-mentioned operation, different colors are assigned to individual average link speeds.

For example, if the road on the image is determined to a current road, the red color is indicative of 0 to 10 km per hour, the orange color is indicative of 10 to 20 km per hour, the green color is indicative of 20 to 40 km per hour, and the blue color is indicative of at least 40 km per hour. If the congestion change information has a specific value "1" or "2", a character string ("Increase" or "Reduction") or icon assigned to the specific value "1" or "2" may also be displayed on a corresponding link along with the congestion change information. If the congestion change information has a specific value "0" or "3", a displayed status is not updated to a new status, such that a current displayed status remains.

If a driver requests the display of the average speeds in the links along a driving route, the data broadcasting application manager 713 may show the average speed information corresponding to the links in the front of the current driving route (or the links that belong to a driving route if the route has been predetermined) from among the average speed information received through the traffic information message in the graphic. If a driver requests the display of travel time for the links along a driving route, the data broadcasting application manager 713 may show the travel time information corresponding to the links in the front of the current driving route (or the links that belong to a driving route if the route has been predetermined) from among the travel time information of the links received through the traffic information message in the graphic.

For example, when average speed on a link is delivered with a resolution finer than 1.8 km/h (e.g., the implementations of FIGS. 4A through 4C), the average speed is displayed on a screen by the value included in the corresponding field according to the predetermined resolution (1 km/h in FIG. 4B). Since the resolution is 1 km/h, difference in the average speed between two neighboring links is expressed in 1 km/h resolution (the area marked with 'A') or a multiple of the resolution. If average speed information expressed in another predetermined resolution (0.9 km/h in FIG. 4A or 0.5 km/h and 1 km/h in FIG. 4C) is received, the average speed is obtained by multiplying the received information by the predetermined resolution and difference in the average speed between two neighboring links becomes a multiple of the resolution.

For example, when travel time for a link is provided along with information expressed in units of seconds (e.g., implementations of FIGS. 5A through 5E), the information in units of seconds is also displayed on the screen. If time information expressed only in units of seconds is received, the received travel time for the link may be converted to the format of units of minutes: units of seconds when needed.

The average speed or travel time for the link may be displayed on the map along a forward direction or at predetermined links.

In the implementations of FIGS. 4A and 4C, even though the average speed on a link may show a difference below 1 km/h, since the numeric value of the average speed is displayed separately on the screen, a driver, based on the displayed information or on the travel time which is the length of the corresponding link divided by the average speed including the same resolution, may choose a link to drive through.

According to one implementation for a simplified display, according to the user's choice, average speed on a link may be displayed after throwing away the place values below decimal point. Similarly, as to travel time, only the element in minute may be kept and displayed, the element in second being discarded.

Since the travel time for a link within a decoded status component (ID=01) may have information expressed in units of seconds when the data broadcasting application manager 713 delivers the travel, may deliver two-byte information either by allocating one byte to each of minute and second or by converting the travel time to seconds. (When 16 bit information expressed in units of seconds is received, the information is delivered as received.) Therefore, when the server also provides travel time for a link as the information expressed in units of seconds (e.g., the implementations of FIGS. 5A through 5E), the data broadcasting application manager 713 enables the navigation engine 5 to express the travel time for the link down to seconds; when an automated path finding function is provided, the data broadcasting application manager 713 enables to find the shortest path by using the travel time for the links including the resolution in second.

If the digital broadcast receiver, that is, the terminal in FIG. 17 is equipped with a voice output means, the terminal may output received average speed information or travel time for a specified link or links included in a driving route in voice.

Figure 18:
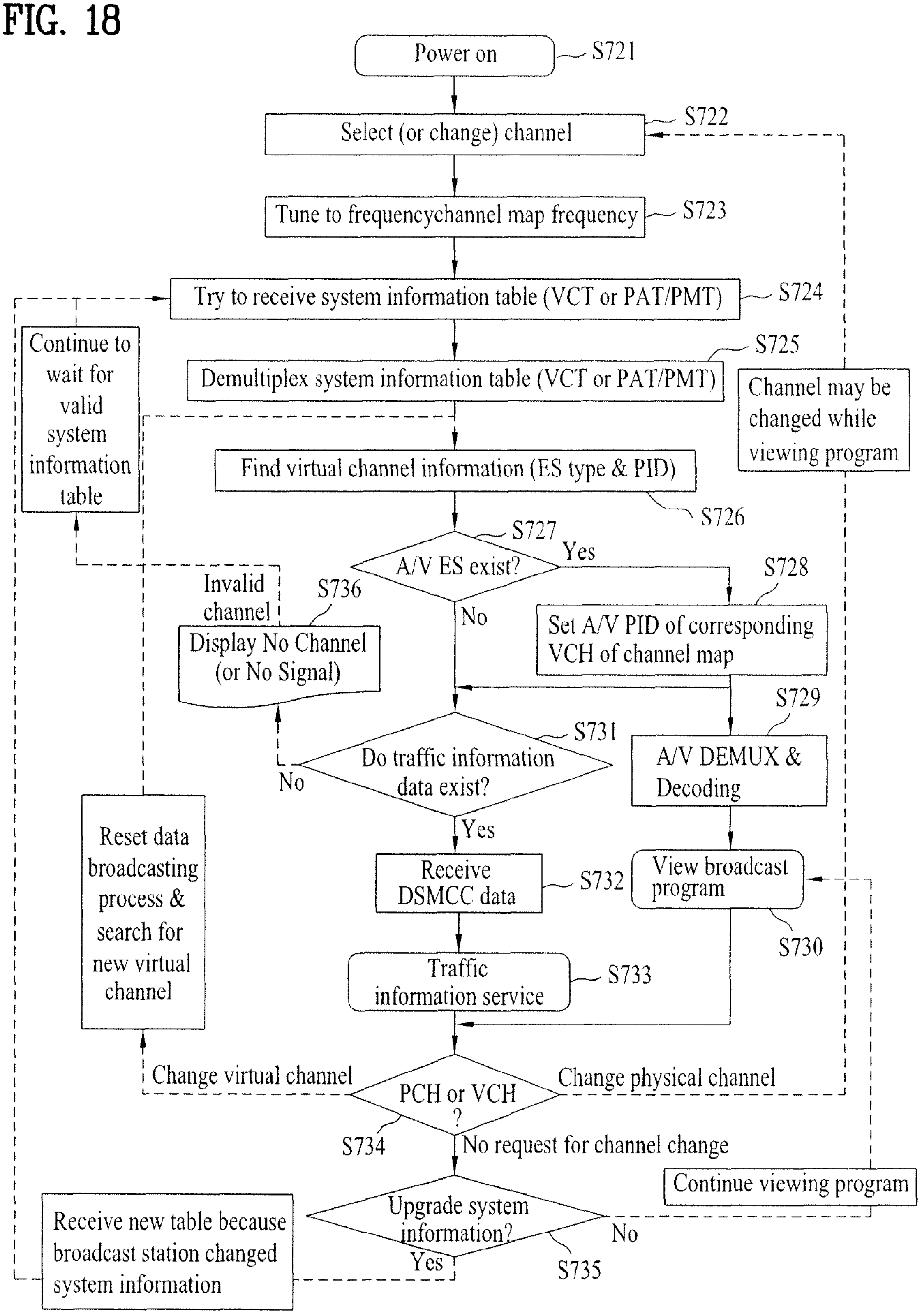
FIG. 18 illustrates process steps of receiving traffic information data according to an embodiment of the present invention.

FIG. 18 illustrates a flow chart showing process steps of receiving and processing traffic information data according to an embodiment of the present invention. Referring to FIG. 18, a method of processing traffic information data according to the present invention will now be described in detail. More specifically, when the power of the receiving system is turned on (S721), and when a channel selection or channel switching is inputted (S722), a received channel signal is tuned to a physical frequency so as to correspond to the selected or switched channel by using the channel map (S723). Herein, the channel selection or channel switching is performed in accordance with a user command or a system command.

At this point, the traffic information data having the traffic information message and the system information multiplexed therein may be received through the channel frequency tuned as described above. If the traffic information data are received (S724), the demultiplexer 703 may demultiplex the traffic information message and system information tables by using PID extraction and section filtering (S725). Among the system information, tables associated with channel information include the VCT or the PAT/PMT. Herein, at least one of the PMT and VCT may include the traffic information descriptor(s) according to the present invention. By parsing the system information table, information on the virtual channel can be obtained, and whether an A/V element stream is being transmitted to the corresponding virtual channel and whether the traffic information data are being transmitted can be known. If the traffic information data are transmitted to the virtual channel, an application identifier, a service component identifier, and service information can be acquired by parsing the traffic information descriptor.

More specifically, information on the virtual channel is extracted by referring to an element stream type (ES type) and PID within the system information table (i.e., VCT and/or PAT/PMT) (S726). If the channel information extracted from the system information table indicates that an A/V ES exists within the virtual channel (S727), an A/V PID of the corresponding virtual channel in the channel map is set up (S728), thereby performing A/V demultiplexing and decoding (S729). Therefore, the user can view the broadcast program corresponding to the A/V (S730). Meanwhile, if it is indicated in Step 727 that an A/V ES does not exist in the virtual channel, the present invention verifies when the traffic information data are being transmitted to the virtual channel (S731).

A plurality of methods for verifying whether the traffic information data have been transmitted to the virtual channel may be proposed. For example, verification can be performed by parsing the system information table, and verification can also be performed by using the PID within the TS packet. When assuming that the traffic information data have been transmitted to the DSM-CC section, the existence (or presence) of the traffic information data can be known by parsing the field value of any one of the stream_type field within the PMT and the stream_type field of the service location descriptor within the VCT. In other words, if the stream type field value is '0x95', this indicates that the traffic information data have been transmitted to the corresponding virtual channel. Therefore, if it is verified in Step 731 that the traffic information data are being transmitted to the virtual channel, all traffic information having the DSM-CC data format that are being transmitted to the virtual channel are received (S732), thereby providing the traffic information service desired (or requested) by the user (S733).

If it is verified, in Step 731, that neither the A/V ES nor the traffic information data exist in the virtual channel, then the corresponding virtual channel is determined to be an invalid channel. In this case, the system may display, for example, a message that no valid channel or signal exists (S736). Thereafter, the process is returned to Step 724 in order to newly receive a valid channel information table.

Meanwhile, the system verifies whether a request for changing (or switching) the channel is made during the data service or while viewing a broadcast program (S734). If a change in channel has been requested, and if the request corresponds to changing the virtual channel, the data broadcasting process is reset, and the process is returned to Step 726 in order to find a new set of virtual channel information. Further, if the request corresponds to changing the physical channel, the process is returned to Step 723 so as to tune to the corresponding physical channel.

However, if there is no request for changing the channel, the system verifies whether a channel information version has been upgraded (S735). If it is determined in Step 735 that the channel information version has been upgraded, this indicates that the channel information has been changed (or modified) by the broadcast station. Therefore, the process is returned to Step 724 in order to receive a new channel information table. Conversely, if it is determined in Step 735 that the channel information has not been changed (or modified), then viewing of the broadcast program may be resumed.

Figure 19:
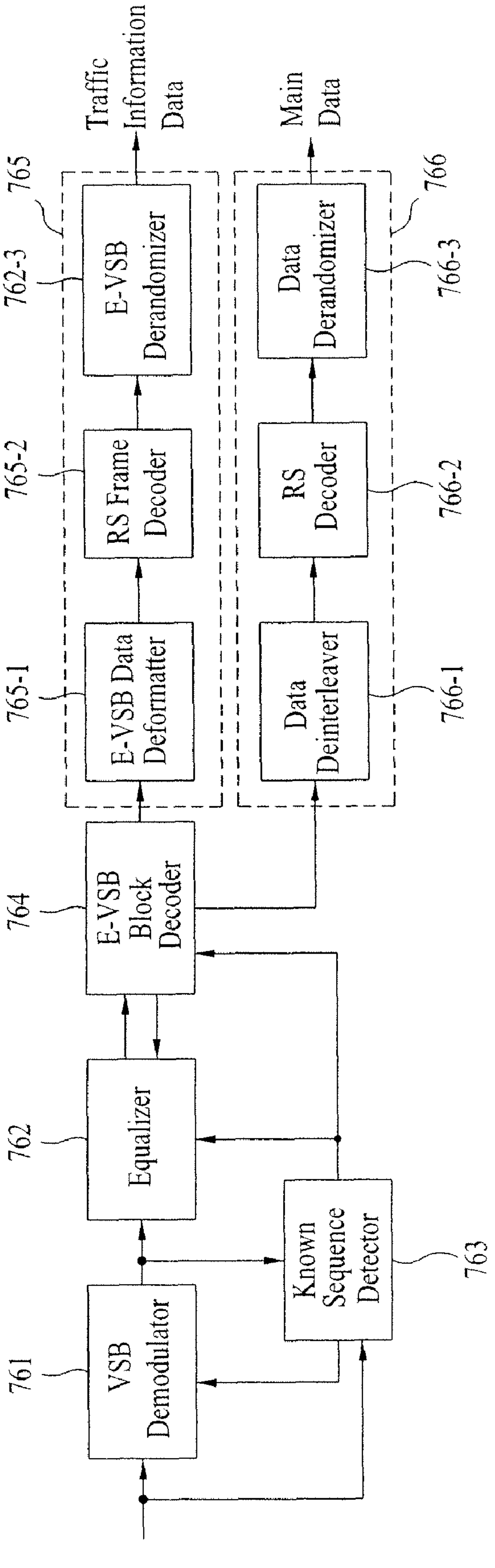
FIG. 19 illustrates a detailed view of a demodulator of FIG. 17 according to a first embodiment of the present invention.
Figure 20:
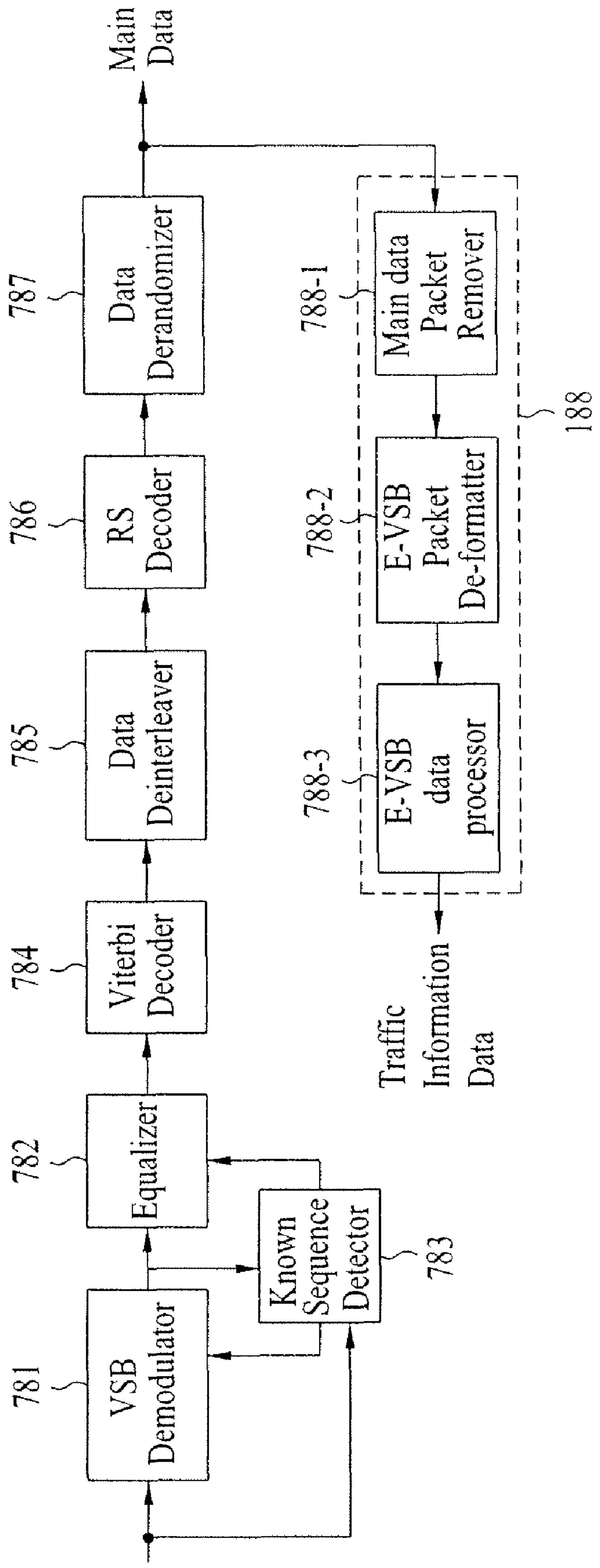
FIG. 20 illustrates a detailed view of a demodulator of FIG. 17 according to a second embodiment of the present invention.

The demodulator (reference numeral 702 of FIG. 17) according to the present invention uses the known data information that is inputted to a traffic information data section and, then, transmitted by a transmitting system so as to perform process such as carrier wave synchronization recovery, frame synchronization recovery, channel equalization, and so on. Thus, the receiving performance can be enhanced. FIG. 19 and FIG. 20 respectively illustrate detailed block views of the demodulator shown in FIG. 17.

Referring to FIG. 19, the demodulator includes a VSB demodulator 761, an equalizer 762, a known sequence (or data) detector 763, an E-VSB block decoder 764, an E-VSB data processor 765, and a main data processor 766. More specifically, an intermediate frequency (IF) signal of a channel frequency tuned by the tuner 701 (shown in FIG. 17) is inputted to the VSB demodulator 761 and the known sequence detector 763. The VSB demodulator 761 performs self gain control, carrier wave recovery, and timing recovery processes on the inputted IF signal, thereby modifying the IF signal to a baseband signal. Then, the VSB demodulator 761 outputs the newly created baseband signal to the equalizer 762 and the known sequence detector 763. The equalizer 762 compensates the distortion of the channel included in the demodulated signal and then outputs the error-compensated signal to the E-VSB block decoder 764.

At this point, the known sequence detector 763 detects the known sequence location inserted by the transmitting end from the input/output data of the VSB demodulator 761 (i.e., the data prior to the demodulation or the data after the modulation). Thereafter, the location information along with the symbol sequence of the known data, which are generated from the detected location, is outputted to the VSB demodulator 761 and the equalizer 762. Further, the known sequence detector 763 outputs information related to the traffic information data additionally coded by the transmitting end and the main data that have not been additionally coded to the E-VSB block decoder 764. Herein, the information allowing the traffic information data and the main data to be differentiated (or identified) by the E-VSB block decoder 764 is outputted to the E-VSB block decoder 764. Although the connection state is not shown in FIG. 19, the information detected by the known sequence detector 763 may be used throughout almost the entire receiving system. Herein, the detected information may also be used in the E-VSB data deformatter 765-1 and in the RS frame decoder 765-2.

The VSB demodulator 761 uses the known data symbol sequence during the timing and/or carrier recovery, thereby enhancing the demodulating performance. Similarly, the equalizer 762 uses the known data sequence, thereby enhancing the equalizing performance. Furthermore, the decoding result of the E-VSB block decoder 764 may also be fed-back to the equalizer 762, thereby enhancing the equalizing performance. Meanwhile, when the data being inputted to the E-VSB block decoder 764, after being equalized by the equalizer 762, correspond to the traffic information data being additionally coded and trellis-encoded by the transmitting end, the equalizer 762 performs an inverse process of the transmitting end by additionally decoding and trellis-decoding the inputted enhanced data. On the other hand, when the data being inputted correspond to the main data being trellis-encoded only and not additionally coded, the equalizer 762 only performs trellis-decoding on the inputted main data.

The data group decoded by the E-VSB block decoder 764 is outputted to the E-VSB data processor 765, and the main data packet is outputted to the main data processor 766. More specifically, when the inputted data correspond to the main data, the E-VSB block decoder 764 performs Viterbi-decoding on the input data so as to output a hard decision value or to perform hard decision on a soft decision value and output the hard-decided result. Meanwhile, when the inputted data correspond to the traffic information data, the E-VSB decoder 764 outputs a hard decision value or a soft decision value on the inputted enhanced value.

More specifically, when the inputted data correspond to the traffic information data, the E-VSB block decoder 764 performs a decoding process on the data encoded by the E-VSB block processor and the trellis encoder of the transmitting system. At this point, the data outputted from the RS frame encoder of the E-VSB pre-processor included in the transmitting system may correspond to an external code, and the data outputted from each of the E-VSB block processor and the trellis encoder may correspond to an internal code. When decoding such concatenated codes, the decoder of the internal code should output a soft decision value, so that the external coding performance can be enhanced. Therefore, the E-VSB block decoder 764 may output a hard decision value on the traffic information data. However, it is more advantageous to output a soft decision value.

As an example of the present invention, the E-VSB data processor 765 includes an E-VSB data deformatter 765-1, a RS frame decoder 765-2, and an E-VSB derandomizer 765-3. It would be efficient to apply this structure in the E-VSB pre-processor of the transmitting system (shown in FIG. 11) which includes an E-VSBG randomizer, a RS frame encoder, an E-VSB block processor, a group formatter, a data deinterleaver, and a packet formatter. The main data processor 766 includes a data deinterleaver 766-1, a RS decoder 766-2, and a data derandomizer 766-3.

Herein, the data deinterleaver 766-1, the RS decoder 766-2, and the data derandomizer 766-3 included in the main data processor 766 are blocks required for receiving the main data. Therefore, these blocks may not be required in the structure of the receiving system that only receives the traffic information data. The data deinterleaver 766-1 performs an inverse process of the data interleaver included in the transmitting end. More specifically, the data deinterleaver 766-1 deinterleaves the main data being outputted from the E-VSB block decoder 764 and outputs the deinterleaved data to the RS decoder 766-2.

The RS decoder 766-2 performs systematic RS decoding on the deinterleaved data and outputs the RS-decoded data to the data derandomizer 766-3. The data derandomizer 766-3 receives the output of the RS decoder 766-2 and generates a pseudo random data byte identical to that of the randomizer included in the transmitting system. Thereafter, the data derandomizer 766-3 performs a bitwise exclusive OR (XOR) operation on the generated pseudo random data byte, thereby inserting the MPEG synchronization bytes to the beginning of each packet so as to output the data in 188-byte main data packet units. At this point, the output of the data derandomizer 766-3 may be inputted to the demultiplexer 703 shown in FIG. 17. Alternatively, the output of the data derandomizer 766-3 may be inputted to a main data specific demultiplexer (not shown), which demultiplexes the A/V data and channel information associated tables from the main data.

The data being outputted from the E-VSB block decoder 764 are inputted to the E-VSB data deformatter 765-1 in a data group form. At this point, the E-VSB data deformatter 765-1 already knows the configuration of the input data group. Accordingly, the E-VSB data deformatter 765-1 removes the main data, the known data that have been inserted in the data group, the trellis initialization data, the MPEG header, and the RS parity added by the RS encoder of the transmitting system that all were inserted in the main data group. Thereafter, the E-VSB data deformatter 765-1 outputs only the traffic information data to the RS frame decoder 765-2. More specifically, the RS frame decoder 765-2 receives only the traffic information data RS-coded and/or CRC-coded by the E-VSB data deformatter 765-1.

The RS frame decoder 765-2 performs an inverse process of the RS frame encoder included in the transmitting system. Accordingly, the RS frame decoder 765-2 corrects the errors within the RS frame. Thereafter, the RS frame decoder 765-2 adds a 1-byte MPEG synchronization byte, which was removed during a RS frame coding process, to the error-corrected traffic information data packet. Then, the processed data are outputted to the E-VSB data derandomizer 766-3. At this point, if a row permutation process was performed on the traffic information data, an inverse row permutation process is also required. The E-VSB data derandomizer 766-3 performs a derandomizing process, which corresponds to an inverse process of the E-VSB randomizer included in the transmitting system, on the inputted traffic information data and outputs the processed data. Thus, the transmitting system can receive the transmitted traffic information data.

Meanwhile, if the E-VSB randomizer is positioned after the RS frame encoder in the structure of the E-VSB pre-processor included in the transmitting system, the E-VSB data processor may include only the E-VSB data deformatter and the RS frame decoder. In this case, the operation of the E-VSB data deformatter becomes partially different from that of the E-VSB data deformatter shown in FIG. 19. In other words, the difference between the E-VSB data deformatter of FIG. 19 and the above-described E-VSB data deformatter is that a derandomizing process is first performed on the traffic information data, and the RS frame decoding process is performed afterwards.

In this case, only the data derandomizing process may be performed, or the data derandomizing process may be processed along with the null data removing process. This may differ depending upon the structure and operation of the E-VSB pre-processor included in the transmitting system. More specifically, only the data derandomizing process may be performed, or the data derandomizing process and the null data removing process may both be processed depending upon the positioning order of the E-VSB block processor and the group formatter, and whether the coding process was performed only on the valid data by the E-VSB block processor.

For example, if the E-VSB block processor is positioned before the group formatter in the E-VSB pre-processor, the receiving system does not require the null data to be removed, since byte expansion has not been performed. In addition, even though a byte expansion process has been performed, if the E-VSB block processor has performed an additional coding process only on the valid data (e.g., if the coding process was performed at a coding rate of ½ or at a coding rate of ¼), the receiving system does not require the process of removing the null data. Conversely, if the E-VSB block processor is positioned after the group formatter in the E-VSB pre-processor, the receiving system requires a byte expansion process to be performed. In this case, if the E-VSB block processor has performed an additional coding process all data types (e.g., if the coding process was performed at a coding rate of ½ or at a coding rate of ¼), the receiving system requires the null data to be removed.

However, if the removal of the expanded byte is required, the order of the byte removal process and the derandomizing process may vary depending upon the structure of the transmitting system. More specifically, if the byte expansion is performed after the randomizing process in the transmitting system, then the byte removal process is first performed before performing the derandomizing process in the receiving system. Conversely, if the order of the process is changed in the transmitting system, the order of the respective processes in the receiving system is also changed.

When performing the derandomizing process, if the RS frame decoder requires a soft decision in a later process, and if, therefore, the E-VSB block decoder receives a soft decision value it is difficult to perform an XOR operation between the soft decision and the pseudo random bit, which is used for the derandomizing process. Accordingly, when an XOR operation is performed between the pseudo random bit and the soft decision value of the traffic information data bit, and when the pseudo random bit is equal to '1', the E-VSB data deformatter changes the code of the soft decision value and then outputs the changed code. On the other hand, if the pseudo random bit is equal to '0', the E-VSB data deformatter outputs the soft decision value without any change in the code. Thus, the state of the soft decision may be maintained and transmitted to the RS frame decoder.

If the pseudo random bit is equal to '1' as described above, the code of the soft decision value is changed because, when an XOR operation is performed between the pseudo random bit and the input data in the randomizer of the transmitter, and when the pseudo random bit is equal to '1', the code of the output data bit becomes the opposite of the input data (i.e., 0 XOR 1=1 and 1 XOR 0=0). More specifically, if the pseudo random bit generated from the E-VSB packet deformatter is equal to '1', and when an XOR operation is performed on the hard decision value of the traffic information data bit, the XOR-operated value becomes the opposite value of the hard decision value. Therefore, when the soft decision value is outputted, a code opposite to that of the soft decision value is outputted.

Accordingly, the RS frame decoder performs an inverse process of the RS frame encoder included in the transmitting system. Therefore, the RS frame decoder corrects the errors within the RS frame. Subsequently, the RS frame decoder adds a 1-byte MPEG synchronization byte, which was removed during a RS frame coding process, to the error-corrected traffic information data packet. Thus, the initial traffic information data transmitted by the transmitting system can be obtained.

FIG. 20 illustrates a detailed block view of the demodulator according to a second embodiment of the present invention. Referring to FIG. 20, the demodulator includes a VSB demodulator 781, an equalizer 782, a known sequence (or data) detector 783, a Viterbi decoder 784, a data deinterleaver 785, a RS decoder 786, a data derandomizer 787, and an E-VSB data processor 788. Herein, the E-VSB data processor 788 includes a main data packet remover 788-1, an E-VSB packet deformatter 788-2, and an E-VSB data processor 788-3. It would be efficient to apply the demodulator shown in FIG. 20 to the transmitting system having the structure shown in FIG. 16. Furthermore, the VSB demodulator 781, the equalizer 782, and the known sequence detector 783 are identical to those shown in FIG. 19. Therefore, since reference can be made for the structure of the same components, a detailed description of the same will be omitted for simplicity.

The Viterbi decoder 784 Viterbi-decodes the data outputted from the equalizer 782 and converts the Viterbi-decoded data to bytes. Thereafter, the converted data are outputted to the data deinterleaver 785. The data deinterleaver 785 performs an inverse process of the data interleaver of the transmitting system and outputs the deinterleaved data to the RS decoder 786. If the received data packet is the main data packet, the RS decoder 786 RS-decodes the received main data packet. Alternatively, if the received data packet is the traffic information data packet, the RS decoder 786 removes the non-systematic RS parity bytes and outputs the processed data to the data derandomizer 787.

The data derandomizer 787 performs an inverse process of the randomizer of the transmitting system on the output of the RS decoder 786. Thereafter, the data derandomizer 787 inserts the MPEG synchronization byte in the beginning of each packet, thereby outputting the data in 188-byte packet units. The output of the data derandomizer 787 is simultaneously outputted to the demultiplexer 703 (shown in FIG. 17) or the main data specific demultiplexer (not shown) and outputted to the main data packet remover 788-1 of the E-VSB data processor 788.

The main data packet remover 788-1 removes the 188-byte main data packet from the data outputted from the data derandomizer 787 and outputs the processed data to the E-VSB packet deformatter 788-2. The E-VSB packet deformatter 788-2 removes the 4-byte MPEG header, known data, and trellis initialization data from the 188-byte data packet. Then, the E-VSB packet deformatter 788-2 outputs only the traffic information data to the E-VSB data processor 788-3. At this point, the E-VSB packet deformatter 788-2 may or may not remove the null data.

More specifically, when the E-VSB post-processor of the transmitting system shown in FIG. 16 performs additional coding on the traffic information data, and, accordingly, when the coding is performed only on the valid traffic information data, the removing of the null data is not required. Conversely, however, if the additional coding process is performed on all byte-expanded traffic information data, the null data must be removed. The E-VSB data processor 788-3 performs an inverse process of the E-VSB pre-processor included in the transmitting system on the output of the E-VSB packet deformatter 788-2. Thus, the traffic information data initially transmitted from the transmitting system may be obtained.

As described above, the digital broadcast transmitting/receiving system and the method for processing data are advantageous in that when receiving traffic information data through a channel, the data are robust against error and are compatible with the conventional VSB receiver. Furthermore, data can be received more efficiently without error even in channels having severe noise and ghost effect.

In addition, by performing additional error correction coding and error detection coding processes on the traffic information data and transmitting the processed data, robustness is provided to the traffic information data, thereby allowing the data to respond appropriately to the changes in the channel environment. Furthermore, by using link identifiers for providing the traffic information data, the transmission capacity may be minimized. And, by warning in advance the information on heavy congested traffic status, the amount of traffic may be adequately dispersed, thereby allowing the roads to be circulated efficiently. The present invention having the above-described advantages may be more efficiently used when applied in mobile and portable receiver which requires a greater degree of robustness against noise and ghost effect.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital broadcast transmitter, comprising:

a pre-processor for pre-processing enhanced data, wherein the enhanced data and known data are included in a data group, wherein at least three of plurality of sequences of the known data are spaced regularly in the data group, wherein at least one row of the data group is comprised of only the known data immediately after a row of the data group comprising of the known data and the enhanced data, and wherein the pre-processor further comprising:

a randomizer for randomizing the enhanced data;

a first encoder for generating data frames including the randomized data;

a second encoder for encoding the enhanced data included in the data encoded by the first encoder with a coding rate of G/H which is less than 1;

a group formatter for forming the data group having a plurality of regions with the data encoded by the second encoder and the known data;

a data de-interleaver for de-interleaving the data included in the data group; and a packet formatter for adding header data to the de-interleaved data to generate data packets;

a multiplexer for multiplexing the enhanced data with one or more main audio and video (AV) data;

a trellis encoder for having at least one memory and trellis-encoding the multiplexed data, the at least one memory being initialized when data corresponds to a start of the sequences of the known data; and a data transmission unit for inserting synchronization data into the trellis-encoded data, modulating the trellis-encoded data having the synchronization data, and transmitting the modulated data.

2. The digital broadcast transmitter of claim 1, wherein the known data included in the data group are known to the digital broadcast transmitter and a digital broadcast receiver in advance.

3. The digital broadcast transmitter of claim 1, wherein the group formatter further inserts at least one of header location holders, main AV data holders, initialization data location holders and parity data holders into the data group.

4. A digital broadcast receiver, the receiver comprising:

a tuner for receiving digital broadcast signal including enhanced data and known data, wherein the enhanced data and the known data are included in a data group, wherein at least three of plurality of sequences of the known data are spaced regularly in the data group, wherein at least one row of the data group is comprised of only the known data immediately after a row of the data group comprising of the known data and the enhanced data, and wherein the enhanced data and known data result from:

randomizing the enhanced data;

generating data frames including the randomized data;

encoding the enhanced data included in the data encoded by the first encoder with a coding rate of G/H which is less than 1;

forming the data group having a plurality of regions with the data encoded by the second encoder and the known data;

de-interleaving the data included in the data group; and adding header data to the de-interleaved data to generate data packets;

an equalizer for equalizing a channel distortion using at least one sequence of the known data; and a decoder for decoding the received enhanced data.

5. The digital broadcast receiver of claim 4, wherein the known data included in the data group are known to the digital broadcast receiver and a digital broadcast transmitter in advance.

6. The digital broadcast receiver of claim 4, wherein the data group comprises a first region and a second region, the first region having main data and the enhanced data able to be coded at a first code rate, and the second region having the enhanced data able to be coded at a second code rate lower than the first code rate.

7. A method for processing a digital broadcast signal in a transmitter, the method comprising:

generating a data group comprising first segments and second segments, wherein the first segments have an enhanced data and a main data, and the second segments only have an enhanced data, the enhanced data being different from the enhanced data in the first segments, wherein at least one row of the data group is comprised of only the known data immediately after a row of the data group comprising of the known data and the enhanced data; and transmitting the digital broadcast signal having information corresponding to the data group.

8. A method for processing a digital broadcast signal in a receiver, the method comprising:

receiving the digital broadcast signal having information corresponding to a data group, wherein the data group comprises first segments and second segments, the first segments having an enhanced data and a main data, and the second segments only having an enhanced data, the enhanced data being different from the enhanced data in the first segments, wherein at least one row of the data group is comprised of only the known data immediately after a row of the data group comprising of the known data and the enhanced data; and decoding the received digital broadcast signal having the information corresponding to the data group.

9. An apparatus for processing a digital broadcast signal in a transmitter, the apparatus comprising:

a generating unit for generating a data group comprising first segments and second segments, wherein the first segments have an enhanced data and a main data and the second segments have only an enhanced data, the enhanced data being different from the enhanced data in the first segments, wherein at least one row of the data group is comprised of only the known data immediately after a row of the data group comprising of the known data and the enhanced data; and a transmitting unit for transmitting the digital broadcast signal having information corresponding to the data group.

10. An apparatus for processing a digital broadcast signal in a receiver, the apparatus comprising:

a receiving unit for receiving the digital broadcast signal having information corresponding to a data group, wherein the data group comprises first segments and second segments, the first segments having an enhanced data and a main data, and the second segments having only an enhanced data, the enhanced data different from the enhanced data in the first segments, wherein at least one row of the data group is comprised of only the known data immediately after a row of the data group comprising of the known data and the enhanced data; and a decoding unit for decoding the received digital broadcast signal having the information corresponding to the data group.

* * * * *